US012402408B2

(12) United States Patent
Xie et al.

(10) Patent No.: US 12,402,408 B2
(45) Date of Patent: Aug. 26, 2025

(54) STACKED FETS INCLUDING DEVICES WITH THICK GATE OXIDE

(71) Applicant: International Business Machines Corporation, Armonk, NY (US)

(72) Inventors: Ruilong Xie, Niskayuna, NY (US); Julien Frougier, Albany, NY (US); Nicolas Jean Loubet, Guilderland, NY (US); Junli Wang, Slingerlands, NY (US); Ruqiang Bao, Niskayuna, NY (US); Min Gyu Sung, Latham, NY (US); Heng Wu, Santa Clara, CA (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 547 days.

(21) Appl. No.: 17/656,553

(22) Filed: Mar. 25, 2022

(65) Prior Publication Data

US 2023/0307452 A1  Sep. 28, 2023

(51) Int. Cl.
*H10D 84/85* (2025.01)
*H01L 23/528* (2006.01)
*H10D 30/01* (2025.01)
*H10D 30/62* (2025.01)
*H10D 30/67* (2025.01)
(Continued)

(52) U.S. Cl.
CPC ........ *H10D 84/856* (2025.01); *H01L 23/528* (2013.01); *H10D 30/024* (2025.01); *H10D 30/031* (2025.01); *H10D 30/62* (2025.01); *H10D 30/6735* (2025.01); *H10D 30/6757* (2025.01); *H10D 62/118* (2025.01); *H10D 84/0167* (2025.01); *H10D 84/0186* (2025.01);
(Continued)

(58) Field of Classification Search
CPC ............ H01L 27/0922; H01L 27/0924; H01L 27/0688; H01L 27/0886; H01L 23/528; H01L 29/0665; H01L 29/42392; H01L 29/785; H01L 29/78696; H01L 29/0673; H01L 29/41725; H01L 29/775; B82Y 10/00; H10D 84/856; H10D 84/853; H10D 84/834; H10D 30/62; H10D 30/6735; H10D 30/6757; H10D 30/43; H10D 62/118; H10D 62/121; H10D 64/251; H10D 88/00
See application file for complete search history.

(56) References Cited

U.S. PATENT DOCUMENTS 7,932,152 B2   4/2011 Wong et al.
9,711,501 B1 * 7/2017 Basker .................. H10D 84/85
(Continued)

FOREIGN PATENT DOCUMENTS

KR    10-1989571 B1   6/2019
TW        I259650 B   1/2005
(Continued)

*Primary Examiner* — Ida M Soward
(74) *Attorney, Agent, or Firm* — Yuanmin Cai

(57) ABSTRACT

A semiconductor device includes a first semiconductor layer and a second semiconductor layer. The first semiconductor layer of the semiconductor device includes a standard-gate field-effect transistor. The second semiconductor layer of the semiconductor device includes an extended-gate field-effect transistor. The first semiconductor layer and the second semiconductor layer are formed on top of one another.

13 Claims, 23 Drawing Sheets

(51) Int. Cl.
*H10D 62/10* (2025.01)
*H10D 84/01* (2025.01)
*H10D 84/03* (2025.01)

(52) U.S. Cl.
CPC ....... *H10D 84/0193* (2025.01); *H10D 84/038* (2025.01); *H10D 84/853* (2025.01)

(56) References Cited

U.S. PATENT DOCUMENTS

| | | | |
|---|---|---|---|
| 10,014,389 | B2 | 7/2018 | Xie et al. |
| 10,229,971 | B1 | 3/2019 | Cheng et al. |
| 10,243,054 | B1* | 3/2019 | Cheng ................. H10D 30/014 |
| 10,515,859 | B2 | 12/2019 | Doris et al. |
| 10,522,655 | B2 | 12/2019 | Mulfinger et al. |
| 10,741,660 | B2 | 8/2020 | Loubet et al. |
| 10,957,599 | B2 | 3/2021 | Bi et al. |
| 11,362,189 | B2* | 6/2022 | Lilak ...................... H01L 24/17 |
| 11,574,845 | B2* | 2/2023 | Chanemougame ........................ H10D 84/0186 |
| 11,640,961 | B2* | 5/2023 | Dewey ................ H10D 84/017 257/288 |
| 12,051,697 | B2* | 7/2024 | Hong ................ H10D 84/0184 |
| 12,342,616 | B2* | 6/2025 | Chen ................. H10D 84/0167 |
| 2007/0205800 | A1 | 9/2007 | Ker et al. |
| 2011/0012085 | A1* | 1/2011 | Deligianni ......... H10D 30/6735 257/E21.409 |
| 2017/0170205 | A1* | 6/2017 | Cheng ................... H10D 86/011 |
| 2019/0172828 | A1* | 6/2019 | Smith ............... H01L 21/28088 |
| 2019/0287864 | A1* | 9/2019 | Cheng ................. H10D 62/364 |
| 2020/0105751 | A1* | 4/2020 | Dewey ................ H10D 62/235 |
| 2020/0287046 | A1* | 9/2020 | Frougier ............ H10D 84/0142 |
| 2020/0294866 | A1* | 9/2020 | Cheng ................ H10D 30/6757 |
| 2021/0217873 | A1* | 7/2021 | Siddiqui ................ H10D 30/43 |
| 2021/0376137 | A1* | 12/2021 | Yang ....................... H10D 30/62 |
| 2022/0301936 | A1* | 9/2022 | Merchant ............. H10D 62/121 |
| 2022/0310456 | A1* | 9/2022 | Hall ................... H10D 30/6735 |
| 2023/0089185 | A1* | 3/2023 | Xie ................... H01L 29/66439 257/369 |
| 2023/0133296 | A1* | 5/2023 | Bao ...................... H10D 30/014 |
| 2023/0299080 | A1* | 9/2023 | Mukesh ............. H01L 29/0673 257/288 |

FOREIGN PATENT DOCUMENTS

| | | | | |
|---|---|---|---|---|
| TW | I269303 B | | 12/2006 | |
| TW | 201125047 A | * | 7/2011 | ........... H10D 30/665 |
| TW | I581536 B | | 5/2017 | |
| TW | 202029505 A | * | 8/2020 | ........... H10D 30/797 |

* cited by examiner

STACKED FETS INCLUDING DEVICES WITH THICK GATE OXIDE

BACKGROUND

The present disclosure relates to the semiconductor device fields. In particular, the present disclosure relates to semiconductor devices having stacked transistors.

A field-effect transistor (FET), sometimes called a unipolar transistor, uses either electrons (in an n-channel FET, also referred to as an nFET) or holes (in a p-channel FET, also referred to as a pFET) for conduction. The four terminals of the FET are referred to as the source, gate, drain, and body, which may also be referred to as the substrate. In a FET, the drain-to-source current flows via a conducting channel that connects the source region to the drain region. The conductivity is varied by the electric field that is produced when a voltage is applied between the gate and source terminals. Accordingly, the current flowing between the drain and source is controlled by the voltage applied between the gate and source.

Relative to transistors produced from a single semiconductor layer, a stacked structure makes it possible to increase the integration density of the transistors in the integrated circuit.

SUMMARY

Embodiments of the present disclosure include a semiconductor device. The semiconductor device includes a first semiconductor layer including a standard-gate field-effect transistor. The semiconductor device further includes a second semiconductor layer including an extended-gate field-effect transistor. The first semiconductor layer and the second semiconductor layer are formed on top of one another.

Additional embodiments of the present disclosure include a first semiconductor layer including a first field-effect transistor device and a second field-effect transistor device. The semiconductor device further includes a second semiconductor layer including a third field-effect transistor device and a fourth field-effect transistor device. The first semiconductor layer is formed on top of the second semiconductor layer such that the first field-effect transistor device is arranged above the third field-effect transistor device and the second field-effect transistor device is arranged above the fourth field-effect transistor device. At least one of the first, second, third, and fourth field-effect transistor devices is an extended-gate field-effect transistor.

Additional embodiments of the present disclosure include a method of making a semiconductor device. The method includes forming a first semiconductor layer including a first field-effect transistor. The method further includes forming a second semiconductor layer on top of the first semiconductor layer. The second semiconductor layer includes a second field-effect transistor. At least one of the first field-effect transistor and the second field-effect transistor is an extended-gate field-effect transistor.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1:
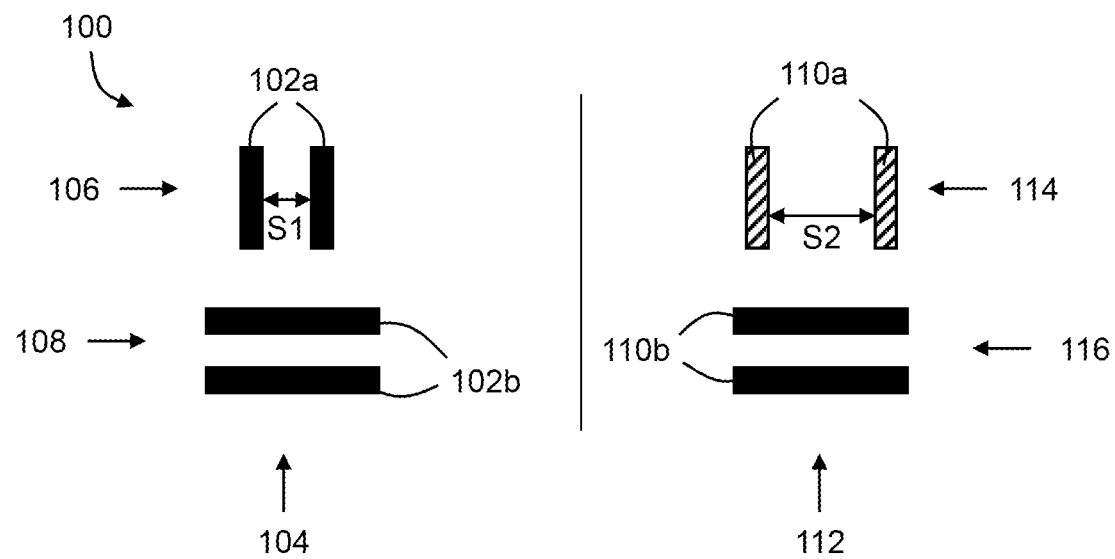
FIG. 1 depicts a schematic diagram illustrating a side view of an example device including stacked FETs, in accordance with embodiments of the present disclosure.

Aspects of the present disclosure relate generally to the electrical, electronic, and computer fields. In particular, the present disclosure relates to semiconductor devices having stacked transistors. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

A field-effect transistor (FET), sometimes called a unipolar transistor, uses either electrons (in an n-channel FET, also referred to as an nFET) or holes (in a p-channel FET, also referred to as a pFET) for conduction. The four terminals of the FET are referred to as the source, gate, drain, and body, which may also be referred to as the substrate. In a FET, the drain-to-source current flows via a conducting channel that connects the source region to the drain region. The conductivity is varied by the electric field that is produced when a voltage is applied between the gate and source terminals. Accordingly, the current flowing between the drain and source is controlled by the voltage applied between the gate and source.

In contemporary semiconductor device fabrication processes, a large number of semiconductor devices, such as nFETs and pFETs, are fabricated on a single wafer. Non-planar transistor device architectures can provide increased device density and increased performance over planar transistors. Additionally, the wafer footprint of a FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure.

Nanosheet transistors are one type of non-planar nanostructure transistor device architecture. In contrast to conventional planar FETs, nanosheet transistors include a gate stack that wraps around the full perimeter of multiple nanosheet channel regions for improved control of channel current flow. Nanosheet transistor configurations enable fuller depletion in the nanosheet channel regions and reduce short-channel effects.

Fin FETs (FinFETs) are another type of non-planar nanostructure transistor device architecture. FinFETs are multi-gate devices, more specifically, metal-oxide-semiconductor field-effect transistors (MOSFETs) built on a substrate such that the gate is placed on two, three, or four sides of the channel or wrapped around the channel, forming a double or multi-gate structure. These devices are referred to as FinFETs because the source/drain region forms three-dimensional (non-planar) fins on the silicon surface. FinFET devices have significantly faster switching times and higher current density than planar CMOS (complementary metal-oxide-semiconductor) technology. It is common for a single FinFET transistor to contain several fins, arranged side by side and all covered by the same gate, that act electrically as one, to increase drive strength and performance.

Although non-planar FET architectures provide increased device density over planar FET architectures, there are still challenges when attempting to fabricate nanostructure FETs that provide the performance characteristics required for a broad range of applications. For example, some applications use transistors, referred to herein as SG (standard-gate) transistors, having thin gate oxides configured to tolerate a maximum gate/threshold voltage ($V_T$) at a predetermined SG level. For some applications (for example, input/output (I/O) circuitry), transistors need to tolerate a $V_T$ that is higher than SG $V_T$ levels. Accordingly, transistors, referred to herein as EG (extended-gate) transistors, having thick gate oxides, which include a thicker gate oxide than SG transistors, have been developed in order to increase the maximum $V_T$ of certain transistors. EG transistors typically have long channels relative to SG transistors. Notably, EG FinFET transistors have a larger spacing between adjacent fins and/or larger fin pitches than SG FinFET transistors. The larger spacing accommodates the thicker gate oxide of the EG FinFET transistors.

One strategy for further improving the integration density of FETs in integrated circuits is to produce integrated circuits including multiple stacked layers of non-planar transistors. Relative to transistors produced from a single semiconductor layer, a stacked structure makes it possible to further increase the integration density of the transistors in the integrated circuit. However, challenges and limitations arise when attempting to stack EG FinFET transistors that are formed on the same substrate with SG FinFET transistors and when attempting to stack FinFET transistors over nanosheet transistors.

More specifically, the integration of EG devices in stacked arrangements is currently limited. One challenge arises out of the fact that semiconductor components do not need as many EG devices as SG devices. Accordingly, to be practical, EG devices should be able to be integrated on the same layer with SG devices. However, because EG devices and SG devices have different channel sizes, they also have different gate pitches, which makes stacking them difficult because top and bottom devices having different gate pitches cannot be wired together with a common wiring.

Additionally, EG devices typically are not used in nanosheets, because the small gaps between nanosheet channels are not able to accommodate the thick gate oxide of EG devices. Accordingly, EG devices are typically used in FinFETs. As a result, another challenge arises out of the need to stack FinFETs on top of nanosheets, and furthermore, how to stack EG FinFETs on top of nanosheets, including SG nanosheets.

Embodiments of the present disclosure may overcome these and other drawbacks of current stacked FET technologies by enabling EG FinFET devices to be stacked with SG devices. As discussed in further detail below, embodiments of the present disclosure enable a single semiconductor layer including an SG FinFET and an EG FinFET to be stacked on top of a semiconductor layer including SG nanosheets. Additionally, embodiments of the present disclosure enable a semiconductor layer including SG nanosheets to be stacked on top of a single semiconductor layer including an SG FinFET and an EG FinFET. Additionally, embodiments of the present disclosure enable a single semiconductor layer including an SG FinFET and an EG FinFET to be stacked on top of another single semiconductor layer including an SG FinFET and an EG FinFET.

FIG. 1 depicts a schematic diagram illustrating a side view of an example device 100 including stacked FETs, in accordance with embodiments of the present disclosure. For simplification in the schematic, FIG. 1 only illustrates the active channels of the FETs. Active channels of FinFETs may also be referred to as fins.

The leftmost portion of FIG. 1 shows FET channels 102*a* and 102*b* in a first region 104 of the example device in which an SG FinFET 106 is stacked over an SG nanosheet 108. Accordingly, FET gates 102*a* of the SG FinFET 106 are stacked over FET channels 102*b* of the SG nanosheet 108. The rightmost portion of FIG. 1 shows FET channels 110*a* and 110*b* in a second region 112 of the example device in which an EG FinFET 114 is stacked over an SG nanosheet 116. Accordingly, FET channels 110*a* of the EG FinFET 114 are stacked over FET channels 110*b* of the SG nanosheet 116.

As illustrated by FIG. 1, the spacing S1 between adjacent channels 102*a* of the SG FinFET 106 is smaller than the spacing S2 between adjacent channels 110*a* of the EG FinFET 114. Additionally, the fin pitch, which refers to the distance between the centers of adjacent fins, is also smaller for the SG FinFET 106 than for the EG FinFET 114.

Notably, the channels 102*a*, 110*a* of the top layers shown in the leftmost portion and the rightmost portion of FIG. 1 show two different portions of the same top single semiconductor layer, and the bottom layers 102*b*, 110*b* shown in the leftmost portion and the rightmost portion of FIG. 1 show two different portions of the same bottom single semiconductor layer. FIGS. 3-17, discussed in further detail below, show cross-sectional schematic views of an example structure cut through the structure such that the portions are arranged in the same manner as FIG. 1.

Figure 2:
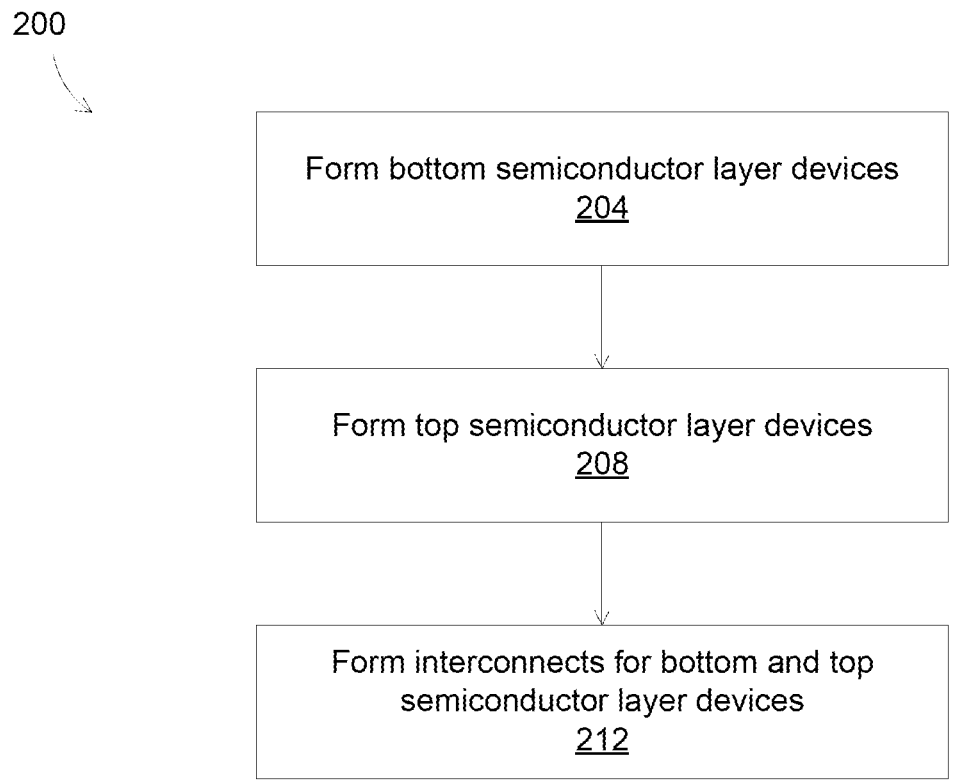
FIG. 2 illustrates a flowchart of an example method for forming a semiconductor device including a stacked FET, in accordance with embodiments of the present disclosure.

FIG. 2 illustrates a flowchart of an example method 200 for forming a semiconductor device including a stacked FET, in accordance with embodiments of the present disclosure. The method 200 begins with operation 204, wherein devices of a bottom semiconductor layer are formed. In accordance with some embodiments of the present disclosure, the performance of operation 204 further includes the performance of a number of sub-operations.

In accordance with at least one embodiment of the present disclosure, the performance of operation 204 includes forming a bottom semiconductor layer having a first portion and a second portion. The first portion includes an SG nanosheet and the second portion includes an SG nanosheet. The performance of operation 204 can include known procedures to form a single semiconductor layer including SG nanosheet portions.

Figure 3:
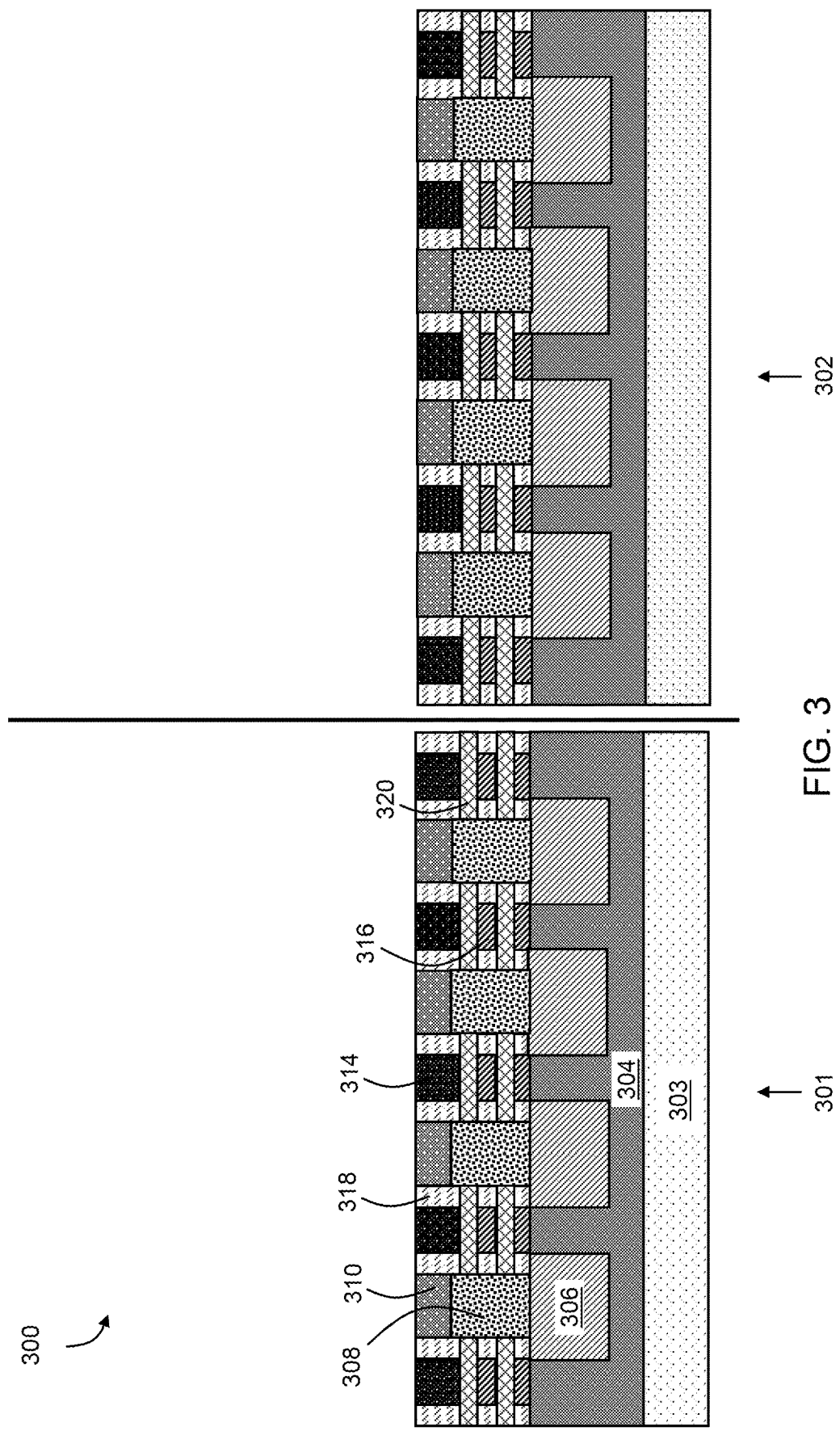
FIG. 3 illustrates a cross-sectional schematic view of an example of a structure following the performance of a portion of the example method of FIG. 2, in accordance with embodiments of the present disclosure.

FIG. 3 depicts an example structure 300 following the performance of the portion of operation 204 described above. The example structure 300 includes a first portion 301 and a second portion 302 that are analogous to the first portion 104 and the second portion 112 of the device 100 shown in FIG. 1. Following the performance of the portion of operation 204 described above, the first portion 301 and the second portion 302 are the same. Accordingly, they are described once together hereinafter.

In both the first and second portions 301, 302, the example structure 300 includes a substrate 303 and a dielectric layer 304 formed on top of the substrate 303. The substrate 303 can be made of, for example, silicon. For instances in which the starting wafer is a silicon on insulator (SOI) substrate, the dielectric layer 304 is a bonding oxide such as, for example, SiO2.

The example structure 300 further includes a plurality of bottom dielectric areas 306, each of which is arranged in the dielectric layer 304 and is in direct contact with a source-drain (S/D) epitaxy 308 arranged on top of a corresponding bottom dielectric area 306. The bottom dielectric areas 306 are made with different material than the dielectric layer 304. For example, the bottom dielectric areas 306 can be made of SiC, SiOC, or another similar dielectric. Each S/D epitaxy 308 is capped with an inter layer dielectric (ILD) 310 to isolate and protect the S/D epitaxy 308 during the performance of subsequent fabrication processes.

The example structure 300 further includes a plurality of dummy gates 314 formed on top of a nanosheet stack. The nanosheet stack includes separation layers 316 that can be made of, for example, silicon germanium (SiGe). The nanosheet stack also includes channel sheets 320 that can be made of Si. The uppermost surfaces of the dummy gates 314 are substantially coplanar with the uppermost surfaces of the ILD 310. Additionally, the example structure 300 further includes a plurality of spacers 318 separating each dummy gate 314 and corresponding separation layer 316 from each S/D epitaxy 308 and corresponding ILD 310.

Like the S/D epitaxies 308, the spacers 318 are formed on top of bottom dielectric areas 306. In contrast, the separation layers 316 are formed on top of the dielectric layer 304. Because the uppermost surfaces of the dielectric layer 304 are substantially coplanar with the uppermost surfaces of the bottom dielectric areas 306, the lowermost surfaces of the S/D epitaxy 308, the spacers 318, and the separation layers 316 are substantially coplanar with one another.

As noted above, the example structure 300 further includes a plurality of channel sheets 320 arranged substantially parallel to the uppermost surface of the dielectric layer 304 and separated from the uppermost surface of the dielectric layer 304. The channel sheets 320 are formed such that they are arranged one above the other and are separated from one another. The example embodiment shown in FIG. 3 includes two channel sheets 320. In such embodiments, both channel sheets 320 are arranged between the uppermost surface of the dielectric layer 304 and the uppermost surface of the S/D epitaxies 308.

In accordance with at least one embodiment of the present disclosure, the performance of operation 204 further includes removing the dummy gates and releasing the corresponding separation layers from the first and second portions of the structure.

Figure 4:
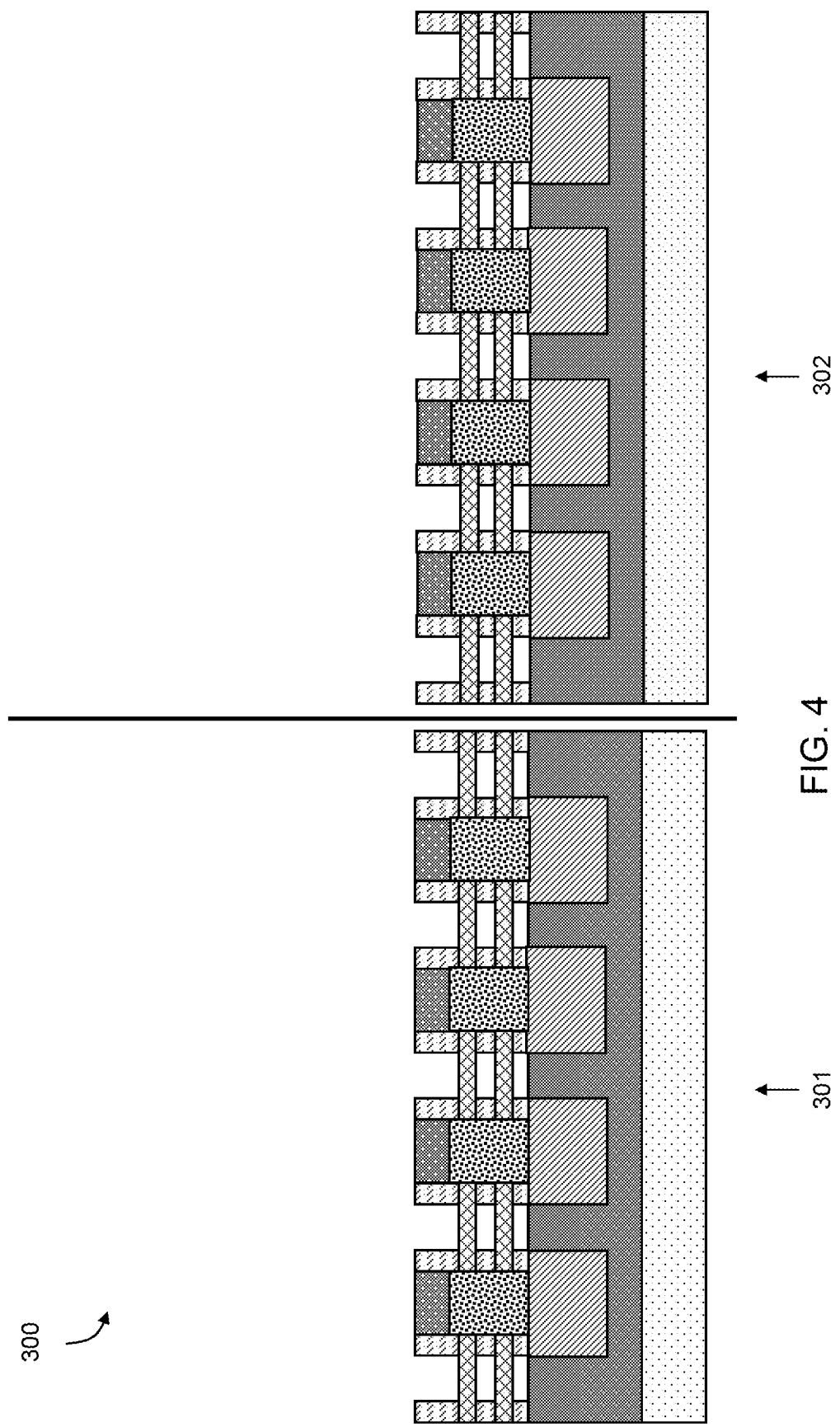
FIG. 4 illustrates a cross-sectional schematic view of an example of a structure following the performance of a portion of the example method of FIG. 2, in accordance with embodiments of the present disclosure.

FIG. 4 depicts the example structure 300 following the performance of the portion of operation 204 described above. As shown, the dummy gates (314 in FIG. 3) and the corresponding separation layers (316 in FIG. 3) have been removed from the first and second portions 301, 302 of the structure 300.

In accordance with at least one embodiment of the present disclosure, the performance of operation 204 further includes filling the spaces left by the removal of the dummy gates and corresponding separation layers. In particular, a replacement high-k gate dielectric material is deposited over the structure, followed by a sacrificial layer. The high-k gate dielectric material can be, for example, HfO2, ZrO2, HfLaOx, HfAlOx, or another similar material. The sacrificial layer can be, for example, a thin layer of titanium nitride, followed by, for example, amorphous silicon (a-Si).

Figure 5:
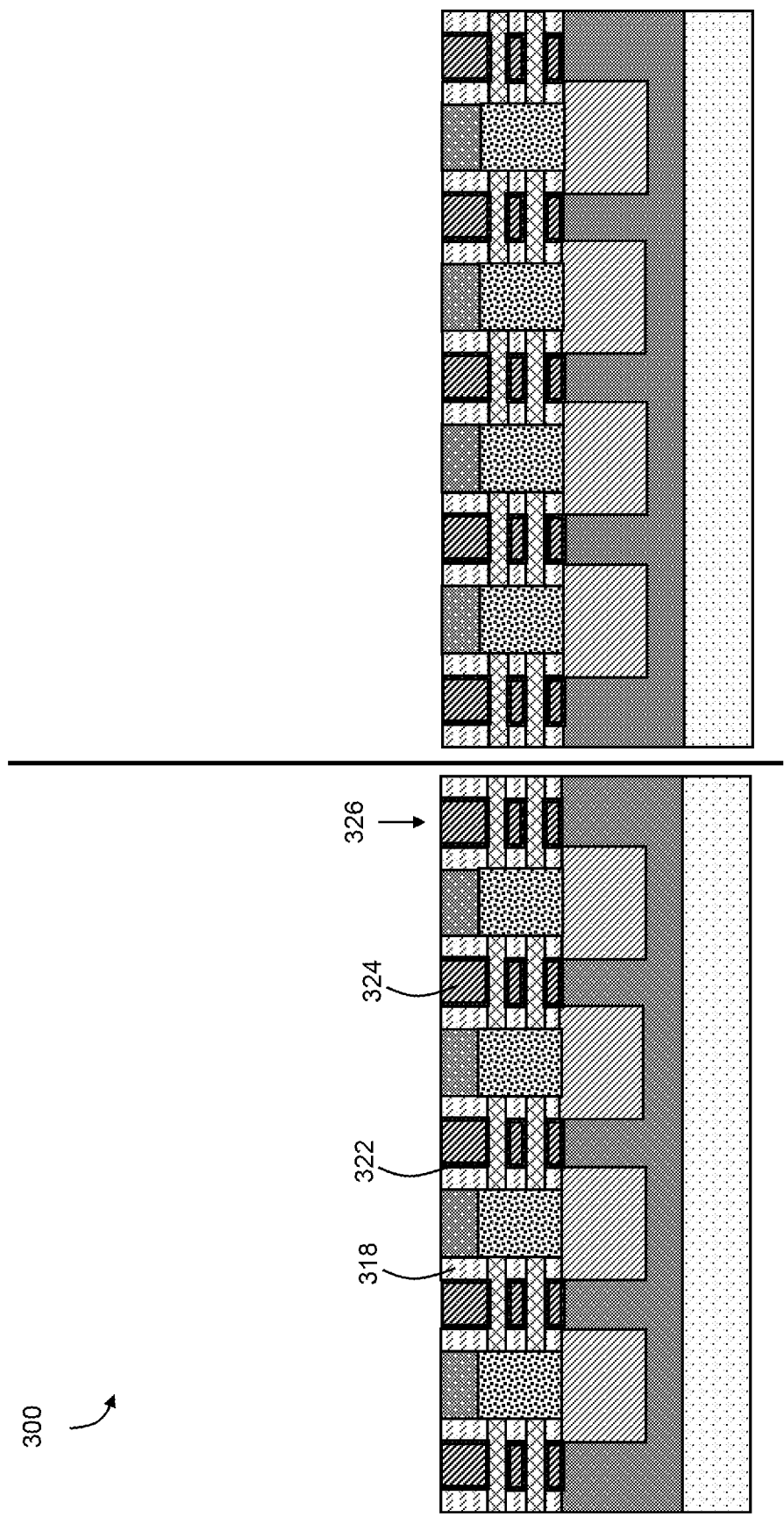
FIG. 5 illustrates a cross-sectional schematic view of an example of a structure following the performance of a portion of the example method of FIG. 2, in accordance with embodiments of the present disclosure.

FIG. 5 depicts the example structure 300 following the performance of the portion of operation 204 described above. As shown, the open spaces between the spacers 318 have been filled with a replacement high-k gate dielectric material 322. Following the formation of the high-k gate dielectric material 322, a sacrificial layer 324 is filled. The sacrificial layer 324 will be removed during subsequent wafer backside processing.

Returning to FIG. 2, following the performance of operation 204, the method 200 proceeds with the performance of operation 208, wherein devices of a top semiconductor layer are formed. In accordance with some embodiments of the present disclosure, the performance of operation 208 further includes the performance of a number of sub-operations.

More specifically, in accordance with at least one embodiment of the present disclosure, the performance of operation 208 further includes forming a top semiconductor layer having a first portion and a second portion. The first portion includes an SG FinFET and the second portion includes an EG FinFET. The performance of operation 208 can include known procedures to form a single semiconductor layer including an SG FinFET and an EG FinFET.

In accordance with at least one embodiment of the present disclosure, the performance of operation 208 further includes forming a further layer of bonding oxide material on top of the bottom semiconductor layer. As discussed in further detail below, the further layer of bonding oxide provides separation of the devices of the bottom semiconductor layer from the devices of the top semiconductor layer, and the further silicon layer will be used to provide the fins which will form the channels for the devices of the top semiconductor layer.

Figure 6:
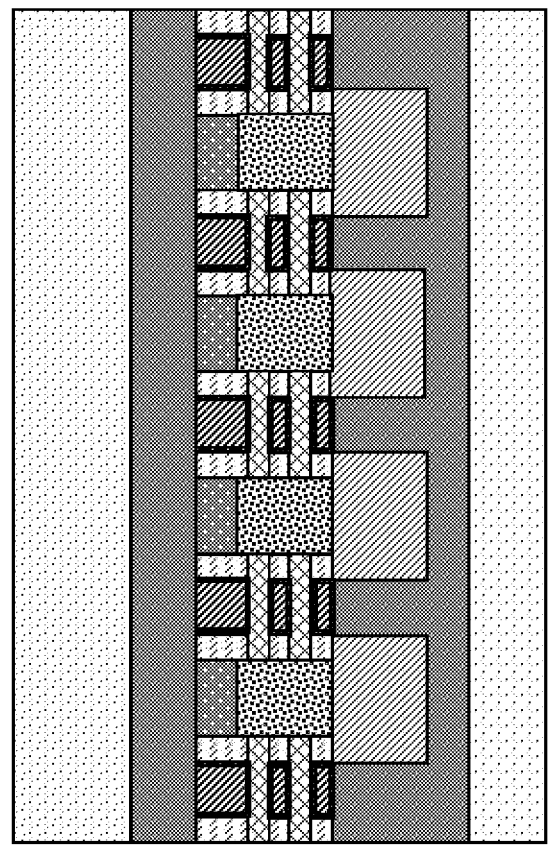
FIG. 6 illustrates a cross-sectional schematic view of an example of a structure following the performance of a portion of the example method of FIG. 2, in accordance with embodiments of the present disclosure.
Figure 6:
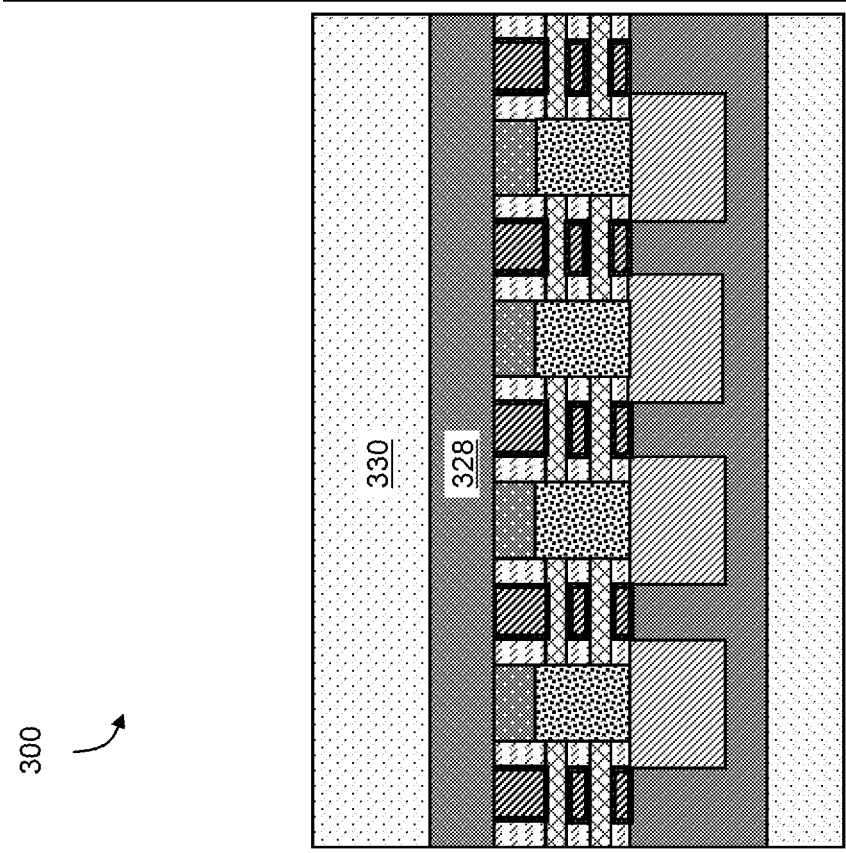

FIG. 6 depicts the example structure 300 following the performance of the portion of operation 208 described above. As shown, a further layer of bonding oxide 328 has been formed so as to cover the entire structure 300. Additionally, a further silicon layer 330 has been formed on top of the further layer of bonding oxide 328 so as to cover the entire structure 300. In accordance with at least one embodiment of the present disclosure, the silicon layer 330 can be formed by bonding a new Si wafer on top of the further layer of bonding oxide 328, followed by performing a Si thinning process.

In accordance with at least one embodiment of the present disclosure, the performance of operation 208 further includes patterning the further silicon layer such that remaining portions of the further silicon layer form fins for the devices of the top semiconductor layer. In particular, the further silicon layer is patterned such that a portion of the further silicon layer forms fins that are spaced relatively close together for an SG FinFET and a portion of the further silicon layer forms fins that are spaced farther apart for an EG FinFET (not shown). In other words, the further silicon layer is patterned to form fins having a smaller fin pitch in a portion that will form the SG FinFET and is patterned to form fins having a larger fin pitch in a portion that will form the EG FinFET.

In accordance with at least one embodiment of the present disclosure, the performance of operation 208 further includes forming dummy gates, spacers, S/D epitaxies, and corresponding ILDs for the devices of the top semiconductor layer that are substantially similar to those discussed above for the devices of the bottom semiconductor layer. Notably, in the portion of the structure that will form the EG FinFET, the gate length is longer than the SG FinFET.

Figure 7:
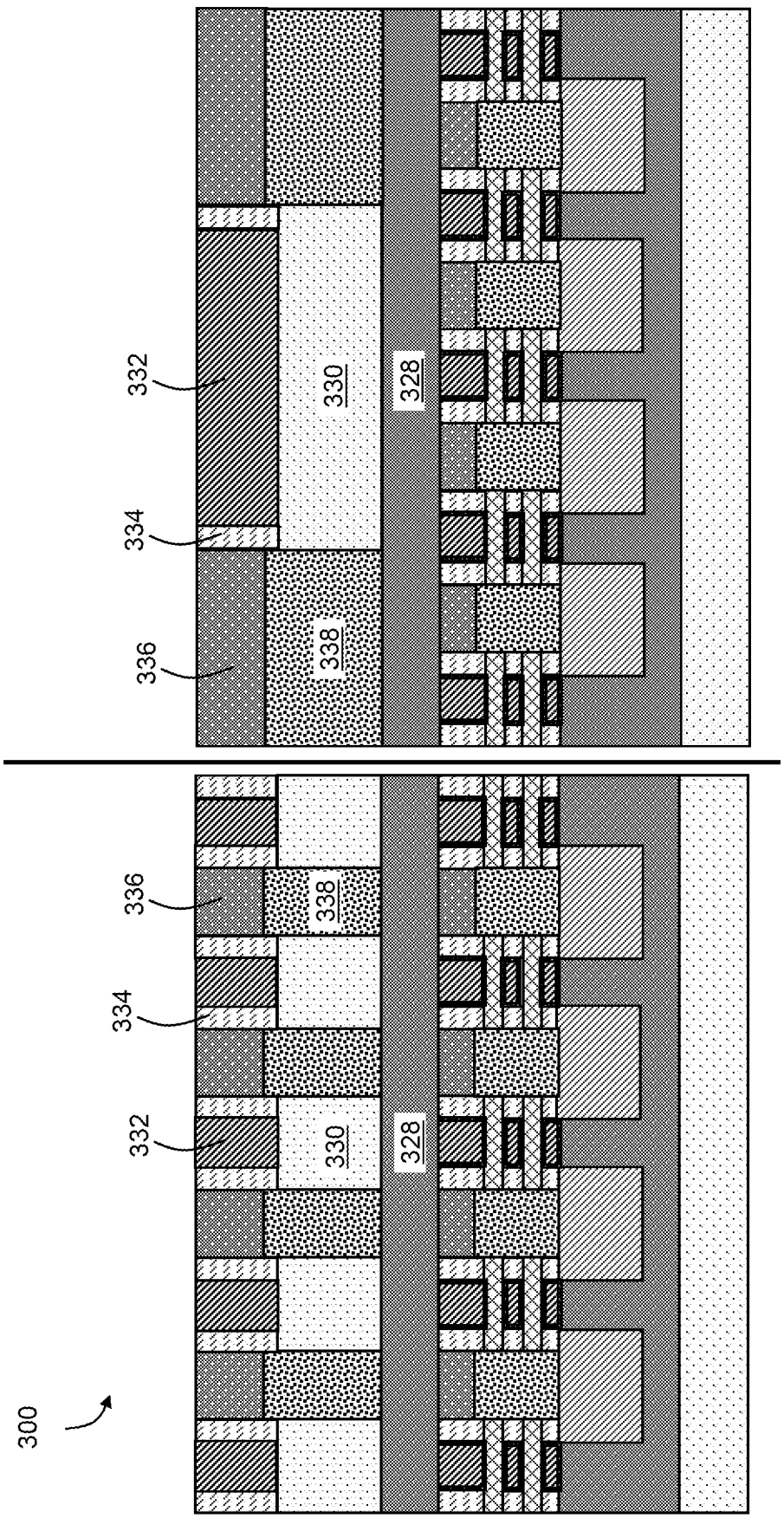
FIG. 7 illustrates a cross-sectional schematic view of an example of a structure following the performance of a portion of the example method of FIG. 2, in accordance with embodiments of the present disclosure.

FIG. 7 depicts the example structure 300 following the performance of the portion of operation 208 described above. As shown, dummy gates 332 have been formed on top of the further silicon layer 330. In the leftmost portion of FIG. 7, which illustrates where the SG FinFET is being formed on top of a corresponding SG nanosheet in the bottom semiconductor layer, top dummy gates 332 are substantially aligned with the gates of the bottom semiconductor device. In the rightmost portion of FIG. 7, which illustrates where the EG FinFET is being formed on top of a corresponding SG nanosheet in the bottom semiconductor layer, since the gate length of the dummy gate of the EG FinFET is much larger, the gates of EG FinFET does not align with the gates of bottom semiconductor device. The number of dummy gates shown in FIG. 7 is for illustrative purposes. In alternative embodiments, more or fewer dummy gates can be formed.

FIG. 7 further depicts spacers 334 formed on either side of each dummy gate 332 to separate each dummy gate 332 from alternating ILDs 336, each of which caps a corresponding S/D epitaxy 338 formed in direct contact with the further layer of bonding oxide 328. Accordingly, the uppermost surface of each dummy gate 332 is substantially coplanar with the uppermost surface of each ILD 336, and the lowermost surface of each S/D epitaxy 338 is substantially coplanar with the lowermost surface of each fin formed by the further silicon layer 330.

In accordance with at least one embodiment of the present disclosure, the performance of operation 208 further includes removing the dummy gates of the top semiconductor layer.

Figure 8:
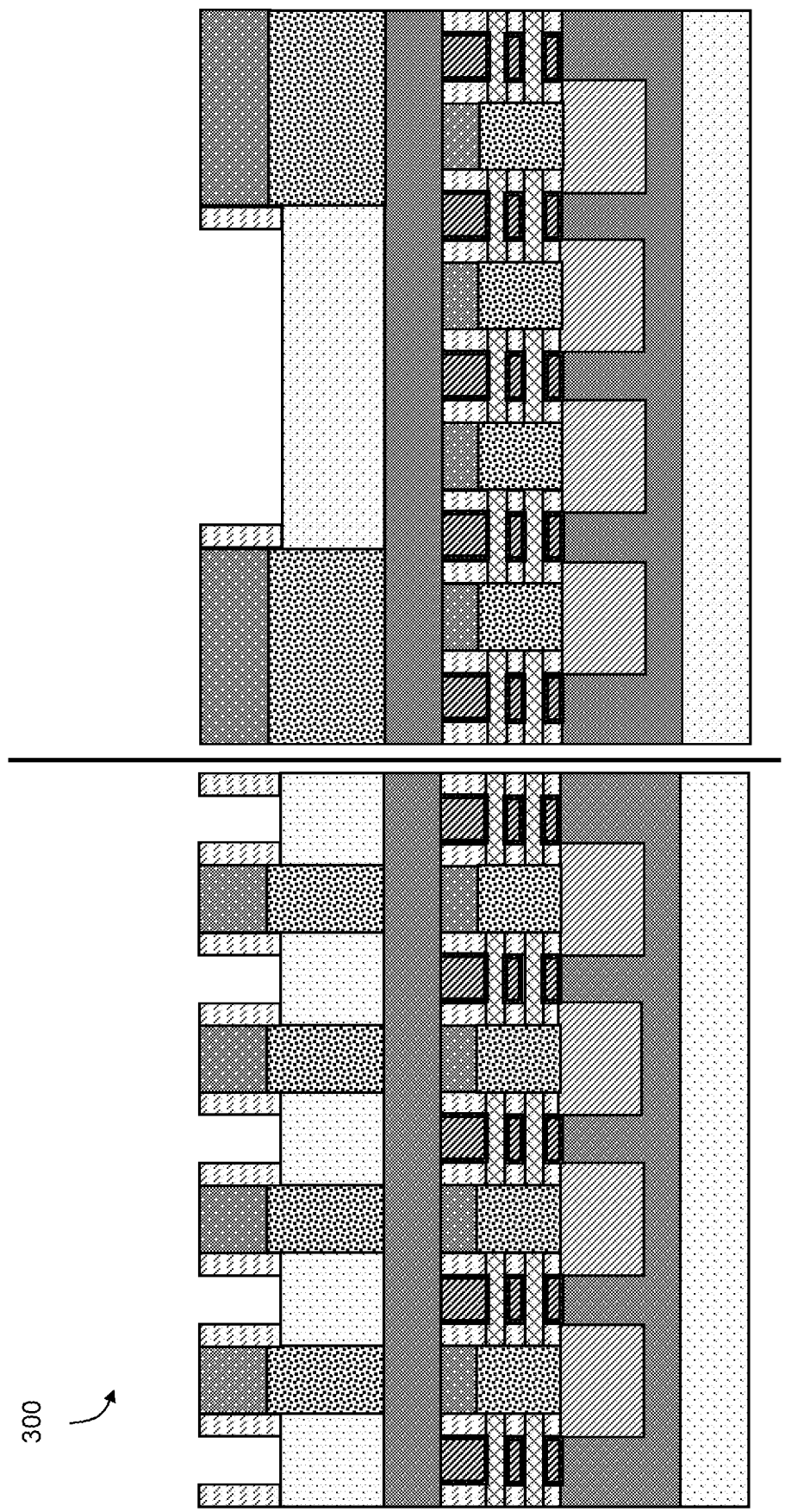
FIG. 8 illustrates a cross-sectional schematic view of an example of a structure following the performance of a portion of the example method of FIG. 2, in accordance with embodiments of the present disclosure.

FIG. 8 depicts the structure 300 following the performance of this portion of operation 208. As shown, an opening has been formed where each dummy gate (332, shown in FIG. 7) has been removed.

In accordance with at least one embodiment of the present disclosure, the performance of operation 208 further includes forming the final gate stack for the devices of the top semiconductor layer. In other words, final gate materials are formed to replace the previously removed dummy gate materials.

More specifically, in the portion of the structure that will form the SG FinFET, a thin layer of gate insulator material is applied in each of the openings that was formed by the removal of the dummy gates. The thin layer can be made of, for example, hafnium oxide (HfO2). The remaining space in each opening is filled with a work function metal, such as for example, TiN, TiC, TiAl, TiAlC and, optionally, a conducting metal, such as tungsten. In contrast, in the portion of the structure that will form the EG FinFET, a layer of thick gate oxide is formed in the opening prior to the thin layer of the gate insulator material. The thick gate oxide in the portion of the structure that will form the EG FinFET provides a thicker oxide to prevent breakdown under the application of higher voltages and power that are applied to EG FinFETs. Notably, the larger pitch between the fins in this portion of the structure are able to accommodate the thickness added by the EG oxide, whereas the smaller pitches between the fins in the portion of the structure that will form the SG FinFET are too small to accommodate this additional thickness.

Figure 9:
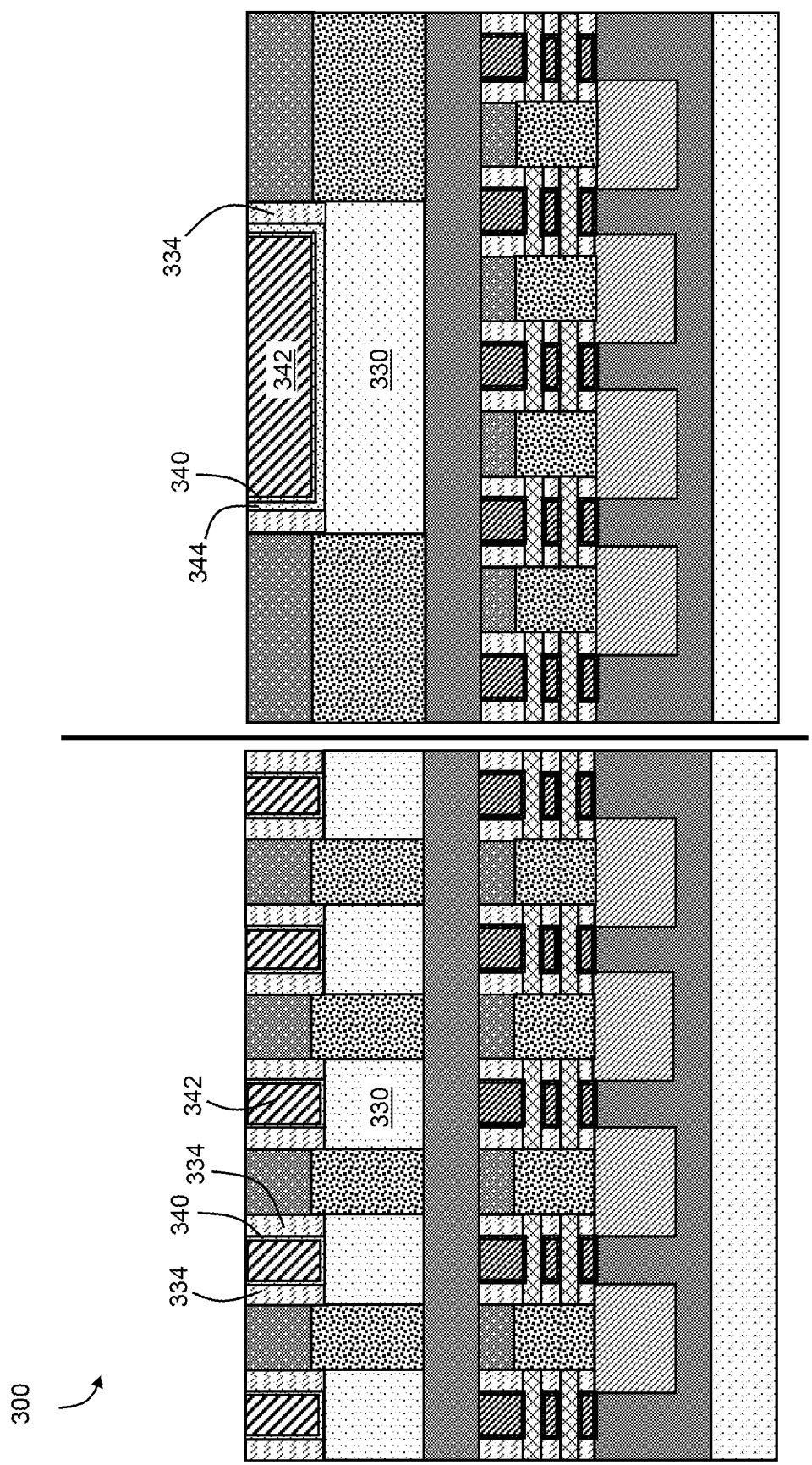
FIG. 9 illustrates a cross-sectional schematic view of an example of a structure following the performance of a portion of the example method of FIG. 2, in accordance with embodiments of the present disclosure.

FIG. 9 depicts the example structure 300 following the performance of this portion of operation 208. As shown, in the leftmost portion of FIG. 9, where the SG FinFET is being formed, a thin layer of gate dielectric 340 (such as, for example, HfO2) is formed in each of the openings between spacers 334. More specifically, the gate dielectric 340 is formed in direct contact with each of a pair of adjacent spacers 334 and with the further silicon layer 330. Remaining space in each lined opening is then filled with work function metal 342 to complete the gates in the SG FinFET.

In the rightmost portion of FIG. 9, where the EG FinFET is being formed, a thick gate oxide layer 344 (for example, SiO2 or SiON) is applied in each opening prior to the thin layer of gate dielectric 340 and the work function metal 342. Accordingly, in the rightmost portion of FIG. 9, the thick oxide layer 344 is formed in direct contact with each spacer 334 and with the further silicon layer 330.

Following the performance of this portion of operation 208, the SG FinFET and EG FinFET devices of the top semiconductor layer are complete. Accordingly, following the performance of this portion of operation 208, the performance of operation 208 is complete.

As shown in FIG. 2, following the performance of operation 208, the method proceeds with operation 212, wherein interconnects are formed for the devices of the bottom and top semiconductor layers. In accordance with some embodiments of the present disclosure, the performance of operation 212 further includes the performance of a number of sub-operations.

More specifically, in accordance with at least one embodiment of the present disclosure, the performance of operation 212 includes forming middle of line (MOL) contacts and back end of line (BEOL) interconnects in electrical contact with the devices of the top semiconductor layer.

Figure 10:
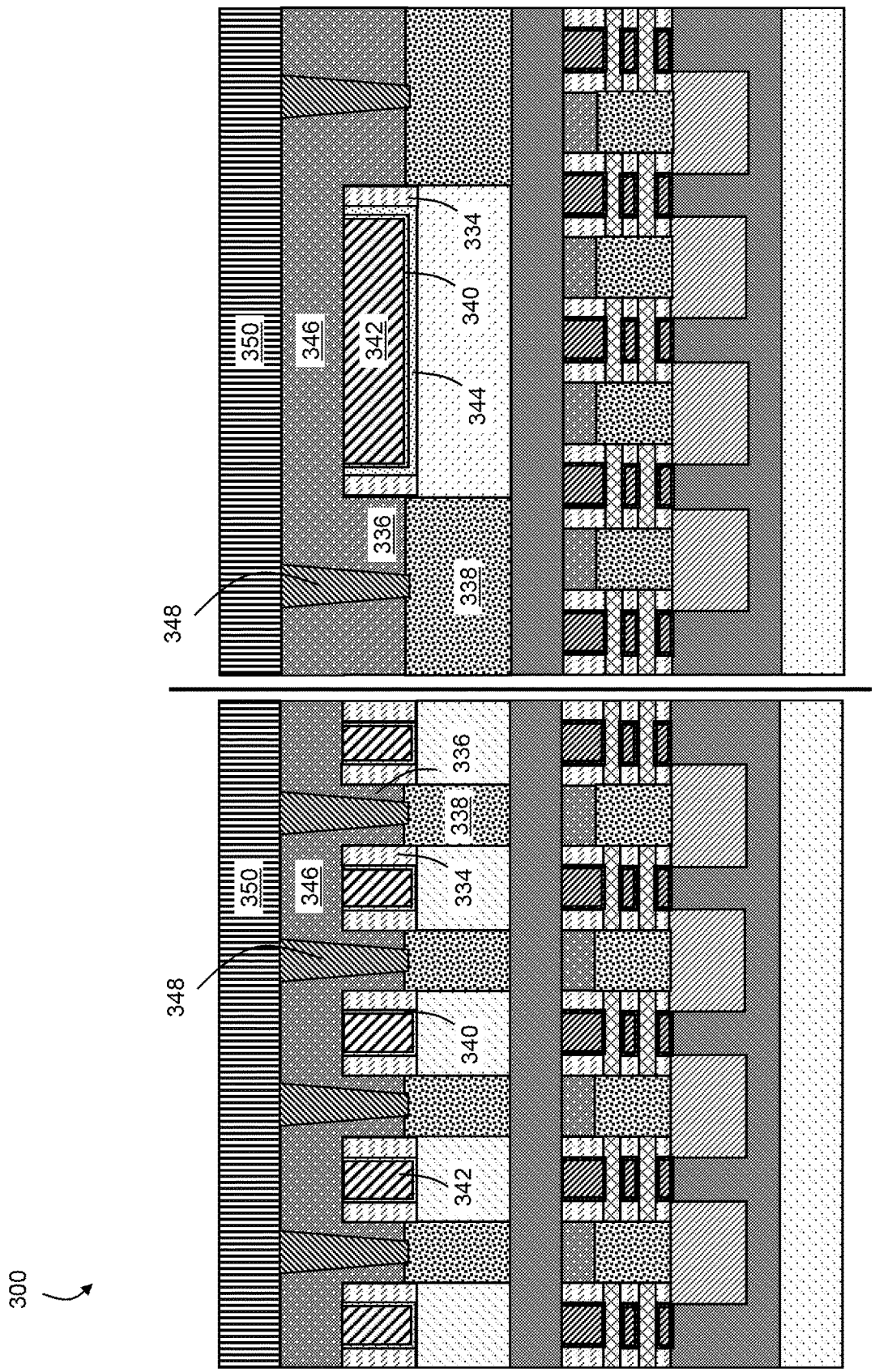
FIG. 10 illustrates a cross-sectional schematic view of an example of a structure following the performance of a portion of the example method of FIG. 2, in accordance with embodiments of the present disclosure.

FIG. 10 depicts the example structure 300 following the performance of this portion of operation 212. As shown, an ILD layer 346 is formed over the entire structure 300 so as to cover the ILDs 336, the spacers 334, and the thin gate dielectric layer 340, work function metal 342, and thick oxide layer 344 of the gates. Subsequently, MOL contact 348 are formed so as to extend through the ILD layer 346 and the ILDs 336 to make electrical contact with each of the S/D epitaxies 338 of the devices of the top semiconductor layer. As further shown in FIG. 10, BEOL interconnects 350 are formed in electrical contact with the MOL contacts 348 to complete front side wiring of the SG FinFET and EG FinFET of the top semiconductor layer.

In accordance with at least one embodiment of the present disclosure, the performance of operation 212 further includes flipping the wafer. More specifically, in such embodiments, the performance of operation 212 may include forming a carrier wafer over the BEOL interconnects for the devices of the top semiconductor layer to enable flipping the entire structure.

Figure 11:
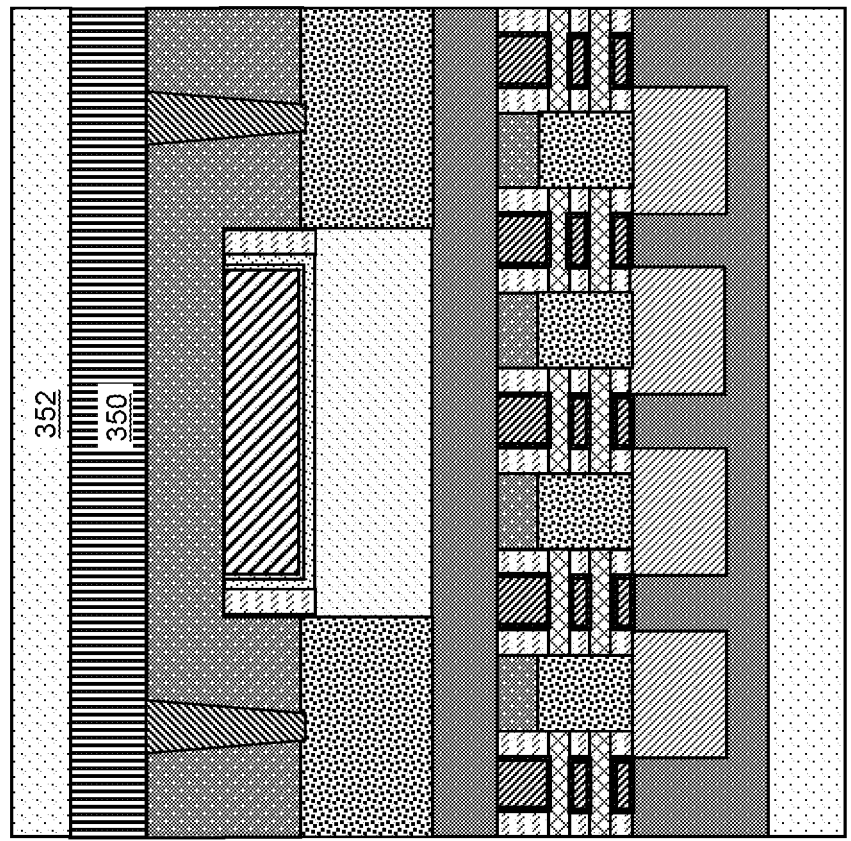
FIG. 11 illustrates a cross-sectional schematic view of an example of a structure following the performance of a portion of the example method of FIG. 2, in accordance with embodiments of the present disclosure.
Figure 11:
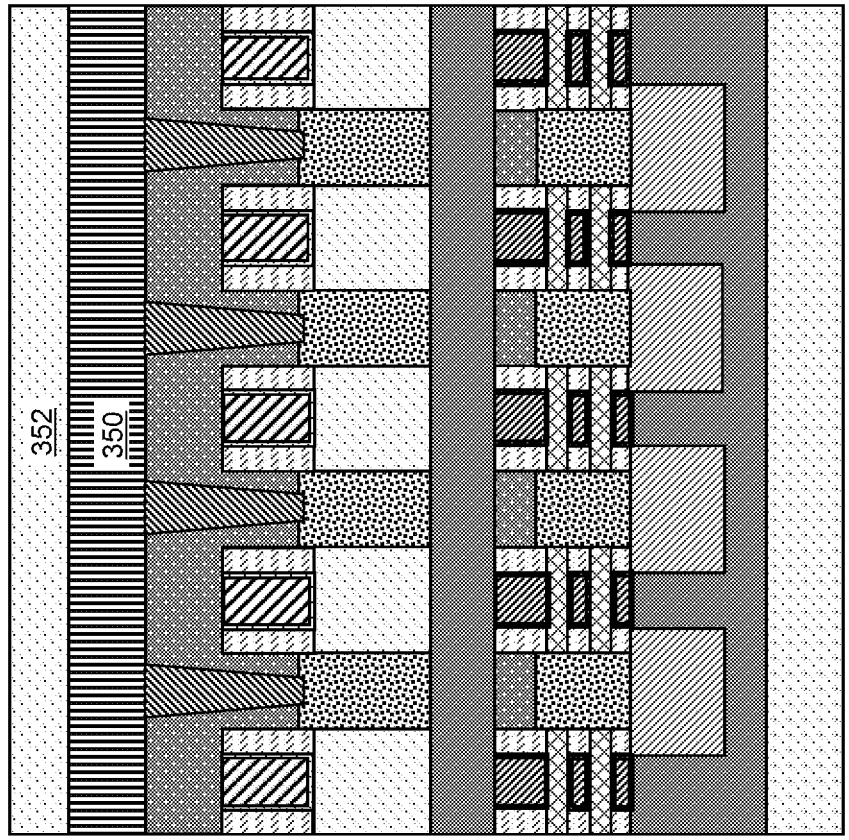

FIG. 11 depicts the example structure 300 following the performance of this portion of operation 212. As shown, a carrier wafer 352 has been formed over the BEOL interconnects 350 to enable flipping the entire structure 300. Notably, the images of the structure 300 are not visually flipped. Instead, the initial orientation of the images is maintained even though processes are subsequently being performed from the bottom side of the structure 300.

Figure 12:
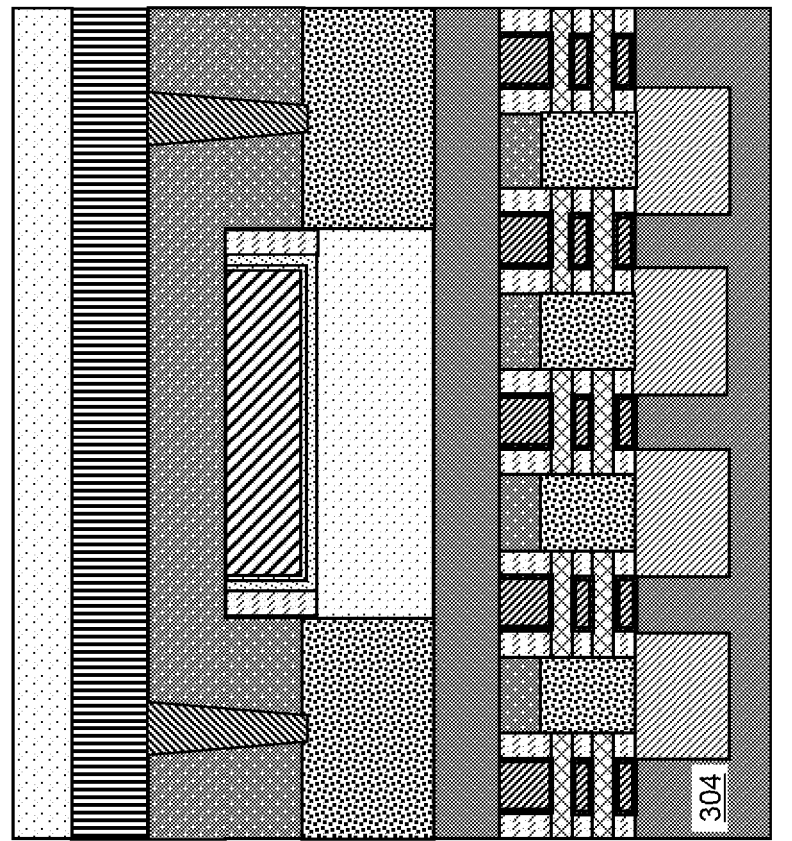
FIG. 12 illustrates a cross-sectional schematic view of an example of a structure following the performance of a portion of the example method of FIG. 2, in accordance with embodiments of the present disclosure.
Figure 12:
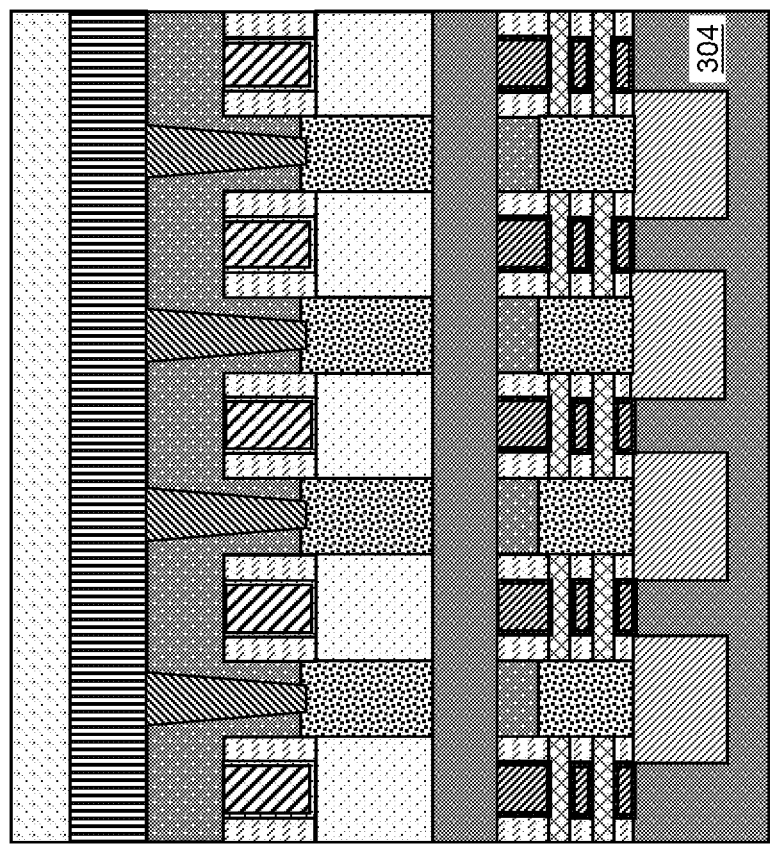

In accordance with at least one embodiment of the present disclosure, the performance of operation 212 further includes removing the substrate from the structure. FIG. 12 depicts the example structure 300 following the performance of this portion of operation 212. As shown, the substrate (303, shown in FIG. 3) has been removed from beneath the dielectric layer 304.

In accordance with at least one embodiment of the present disclosure, the performance of operation 212 further includes backside gate opening by removing the dielectric layer 304 and thereby exposing portions of the high-k dielectric material 322.

Figure 13:
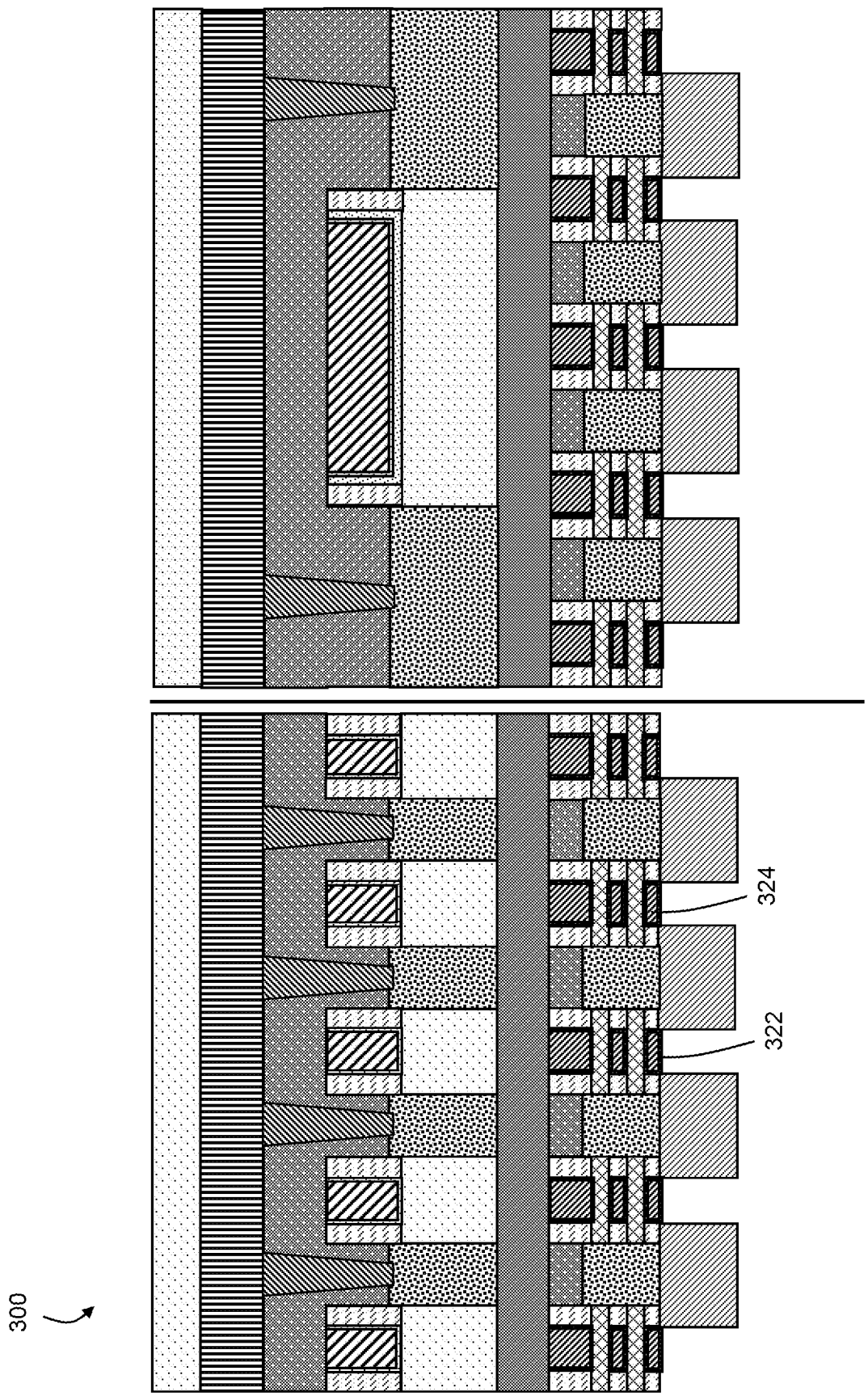
FIG. 13 illustrates a cross-sectional schematic view of an example of a structure following the performance of a portion of the example method of FIG. 2, in accordance with embodiments of the present disclosure.

FIG. 13 depicts the example structure 300 following the performance of this portion of operation 212. As shown, some portions of the dielectric layer (304, shown in FIG. 12) have been removed from the structure 300. As a result, where it was in contact with the dielectric layer, portions of the high-k gate dielectric material 322 have been exposed.

In accordance with at least one embodiment of the present disclosure, the performance of operation 212 further includes removing the exposed portions of high-k gate dielectric material and subsequently removing the thereby exposed TiN and sacrificial layer 324 that forms the dummy gates for the devices of the bottom semiconductor layer. As a result, openings are formed such that the dummy gates can be replaced with final metal gates for the devices of the bottom semiconductor layer.

Figure 14:
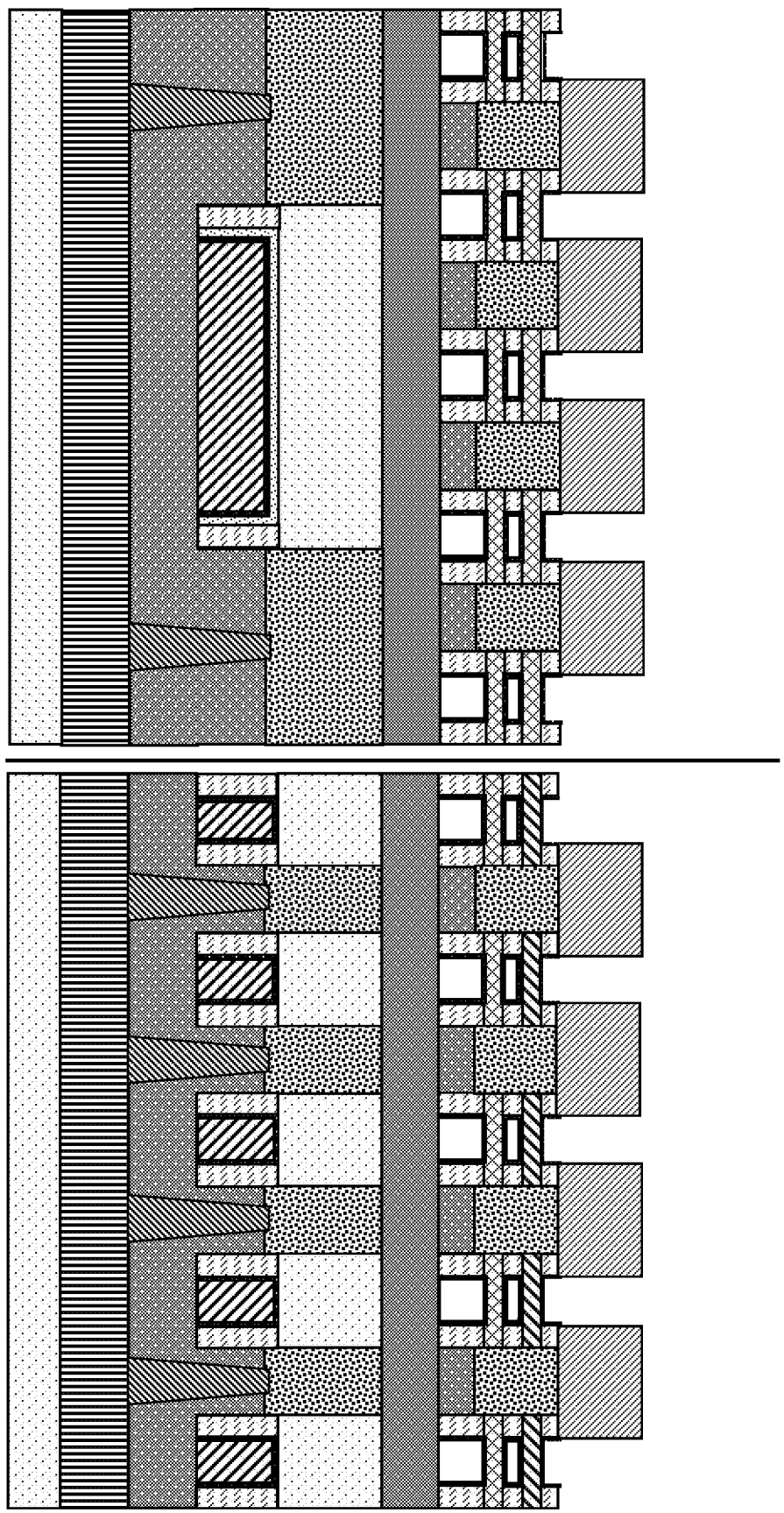
FIG. 14 illustrates a cross-sectional schematic view of an example of a structure following the performance of a portion of the example method of FIG. 2, in accordance with embodiments of the present disclosure.

FIG. 14 depicts the example structure 300 following the performance of this portion of operation 212. As shown, the exposed portions of the high-k gate dielectric material (322, shown in FIG. 13) have been removed, and the thereby exposed TiN and sacrificial layer (324, shown in FIG. 13) that forms the dummy gates for the devices of the bottom semiconductor layer has also been removed so as to form openings for final metal gates for the devices of the bottom semiconductor layer.

In accordance with at least one embodiment of the present disclosure, the performance of operation 212 further includes forming the final metal gate stack for the devices of the bottom semiconductor layer and subsequently recessing the final metal gate stack.

More specifically, forming the final metal gate stack for the devices of the bottom semiconductor layer is substantially similar to forming the final metal gate stack for the devices of the top semiconductor layer, as described above. The remaining space in each opening is filled with a work function metal, such as for example, TiN, TiC, TiAl, TiAlC, etc. After that, a metal CMP and recess can be performed. As a result, final metal gates are formed for the SG nanosheets of the bottom semiconductor layer.

Figure 15:
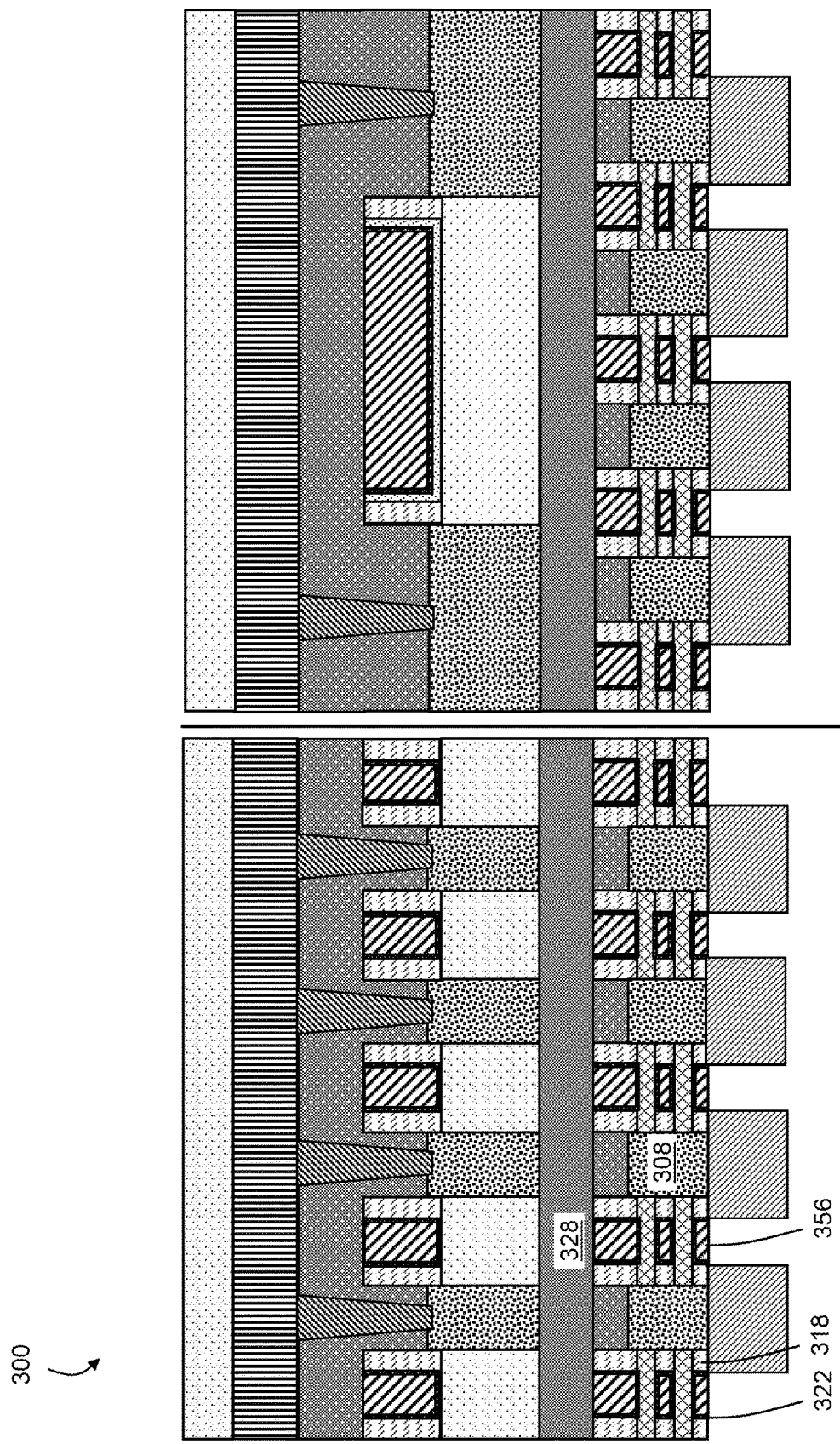
FIG. 15 illustrates a cross-sectional schematic view of an example of a structure following the performance of a portion of the example method of FIG. 2, in accordance with embodiments of the present disclosure.

FIG. 15 depicts the example structure 300 following the performance of this portion of operation 212. As shown, in both the leftmost and rightmost portions of FIG. 15, because SG nanosheets are being formed in both portions of the structure 300, the high-k gate dielectric material 322 is still present. More specifically, the high-k gate dielectric layer 322 is formed early in the process flow before wafer flipping, so a high temperature annealing process was performed earlier to ensure a high quality of the film without concern for the presence of the Cu based BEOL interconnect. Remaining space in each lined opening is then filled with work function metal 356 to complete the gates in the SG nanosheets. FIG. 15 also illustrates that, following formation, the final metal gates are recessed such that a lowermost surface of each final gate is substantially coplanar with a lowermost surface of each S/D epitaxy 308 of the SG nanosheets.

In accordance with at least one embodiment of the present disclosure, the performance of operation 212 further includes forming a bottom ILD layer and forming bottom contacts in electrical contact with the S/D epitaxies 308 of the SG nanosheets. The bottom contacts are formed so as to extend through the bottom dielectric areas.

Figure 16:
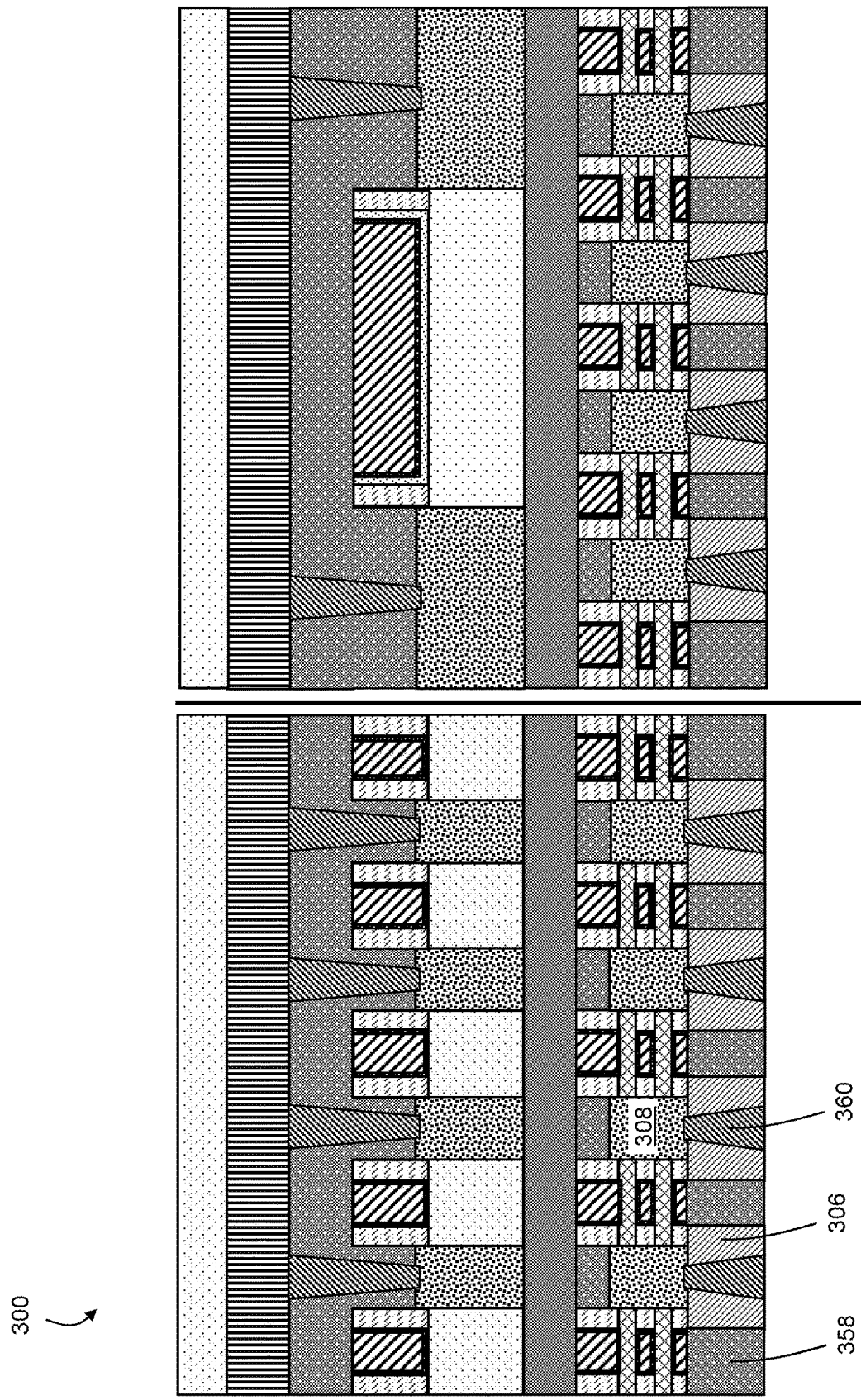
FIG. 16 illustrates a cross-sectional schematic view of an example of a structure following the performance of a portion of the example method of FIG. 2, in accordance with embodiments of the present disclosure.

FIG. 16 depicts the structure 300 following the performance of this portion of operation 212. As shown, the structure 300 includes a bottom ILD layer 358, which fills the openings between each of the bottom dielectric areas 306 that were formed by the removal of the dielectric layer (304, shown in FIG. 12). The structure 300 further includes bottom contacts 360 extending through each bottom dielectric areas 306 to make electrical contact with each of the S/D epitaxies 308 of the SG nanosheets.

In accordance with at least one embodiment of the present disclosure, the performance of operation 212 further includes forming backside interconnects in electrical contact with the bottom contacts to complete the wiring of the SG nanosheets.

Figure 17:
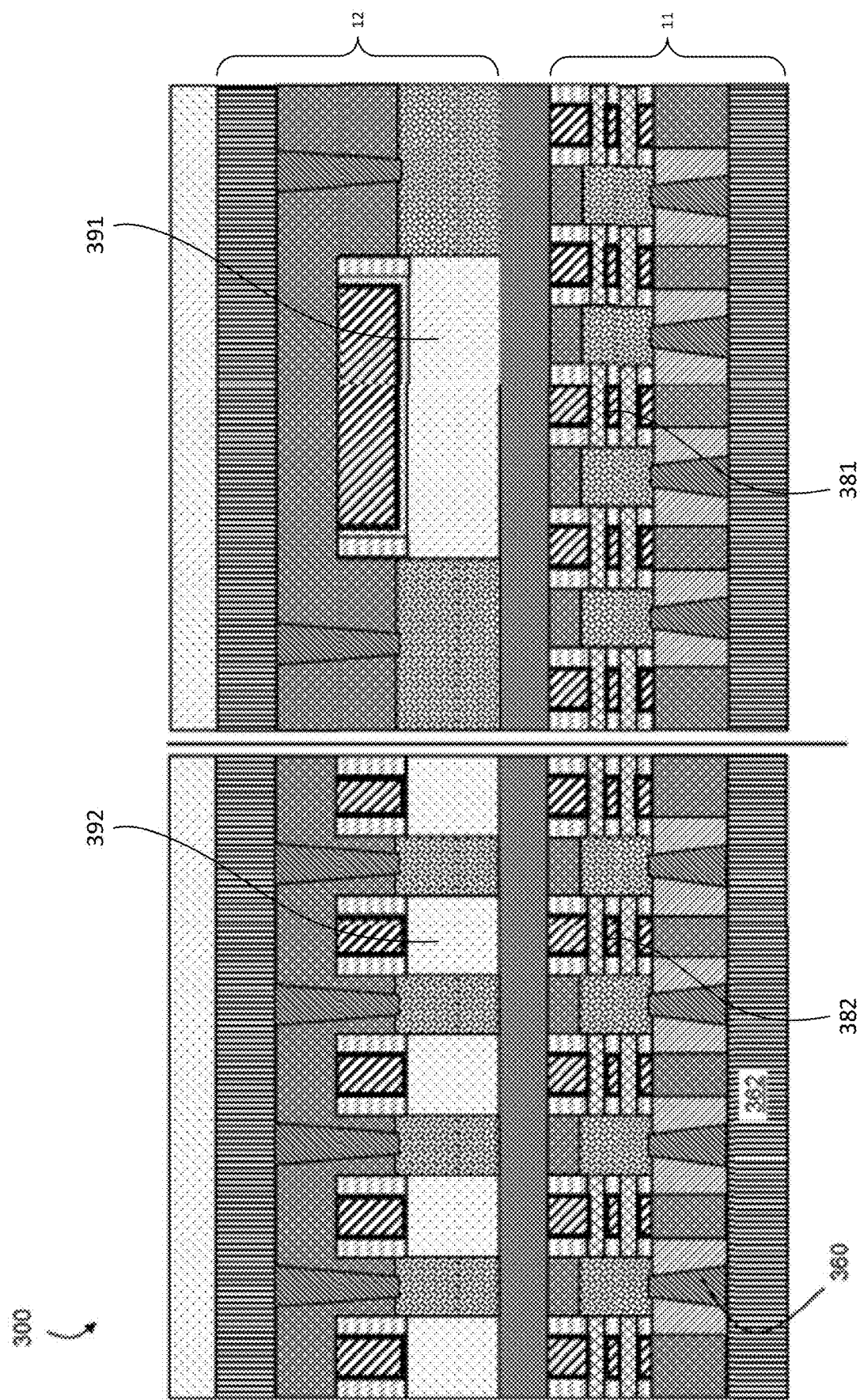
FIG. 17 illustrates a cross-sectional schematic view of an example of a structure following the performance of a portion of the example method of FIG. 2, in accordance with embodiments of the present disclosure.

FIG. 17 depicts the structure 300 following the performance of this portion of operation 212. As shown, a backside interconnect 362 is formed in contact with each of the bottom contacts 360 to complete the back side wiring of the SG nanosheets of the bottom semiconductor layer.

Following the performance of this portion of operation 212, the performance of operation 212, and therefore of the method 200, is complete. Because the structure and method described above incorporate wiring on both the front side and the back side of the structure, the discrepancies in fin pitches between the EG FinFET and the SG nanosheet transistor can be accommodated. Accordingly, as discussed with respect to FIG. 1, an EG FinFET 391 in a top semiconductor layer 12 can be stacked on top of an SG nanosheet transistor 381 or 382 in a bottom semiconductor layer 11, thereby increasing the utility of the structure in various designs. Additionally, the EG FinFET 391 can be integrated on the same semiconductor layer, either in the bottom semiconductor layer 11 or in the top semiconductor layer 12, as the SG FinFET 392. Further increasing the versatility and utility of the structure disclosed herein. The top semiconductor layer 12 (e.g., a first semiconductor layer) is formed on a top side (e.g., a first side) of the bonding oxide layer 328 and the bottom semiconductor layer 11 (e.g., a second semiconductor layer) is formed on a bottom side (e.g., a second side) of the bonding oxide layer 328.

In alternative embodiments of the present disclosure, substantially the same methods and structures described above can be arranged in a different way to enable an EG FinFET that is integrated on the same semiconductor layer as an SG FinFET to be stacked with SG nanosheets.

Figure 18:
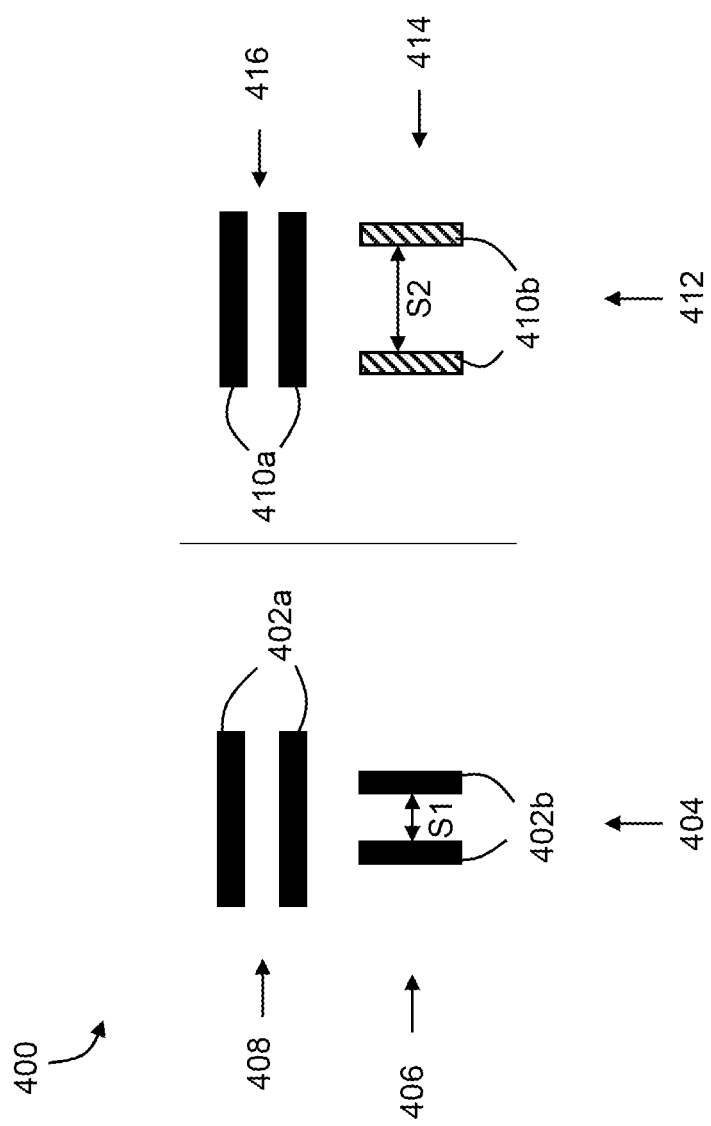
FIG. 18 depicts a schematic diagram illustrating a side view of another example device including stacked FETs, in accordance with embodiments of the present disclosure.

For example, FIG. 18 illustrates an arrangement substantially similar in structure and function to that of the example device 100 shown in FIG. 1, except that in the example device 400 illustrated in FIG. 18, the FET channels 402a and 402b in the first region 404 and the FET channels 410a and 410b in the second region 412 illustrate SG nanosheets 408 and 416 stacked on top of an SG FinFET 406 and an EG FinFET 414. As illustrated by FIG. 18, the spacing Si between adjacent channels 402a of the SG FinFET 406 is smaller than the spacing S2 between adjacent channels 410a of the EG FinFET 414. Additionally, the fin pitch, which refers to the distance between the centers of adjacent fins, is also smaller for the SG FinFET 406 than for the EG FinFET 414.

Figure 19:
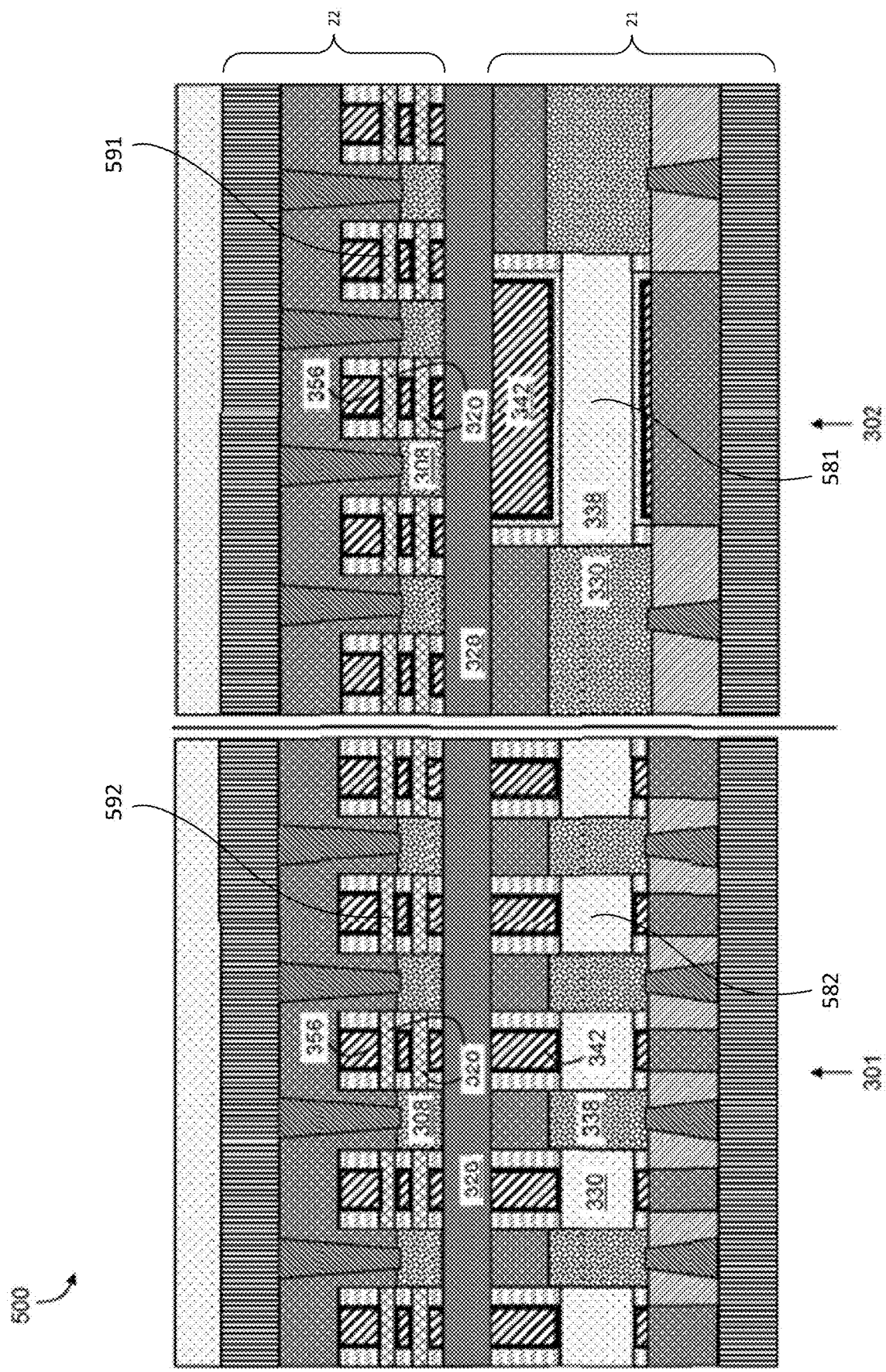
FIG. 19 illustrates a cross-sectional schematic view of an example of a structure including the example device of FIG. 18, in accordance with embodiments of the present disclosure.

FIG. 19 depicts a structure 500 illustrating such an embodiment. Because the SG FinFET and EG FinFETs are formed in the bottom semiconductor layer 21 in the structure 500, the processes and structures differ slightly from those described above with respect to structure 300 wherein the SG FinFET and EG FinFET were formed in the top semiconductor layer 12. For example, in the first portion 301 of the structure 500, the further layer of bonding oxide 328 is arranged above the silicon layer 330, S/D epitaxy 338, and the work function metal 342 of the SG FinFET 582 in the bottom semiconductor layer 21 (e.g., a second semiconductor layer) and is arranged below the channel sheets 320, S/D epitaxy 308, and work function metal 356 of the SG nanosheet transistor 592 in the top semiconductor layer 22 (e.g., a first semiconductor layer). Furthermore, in the second portion 302 of the structure 500, the further layer of bonding oxide 328 is arranged above the silicon layer 330, S/D epitaxy 338, and work function metal 342 of the EG FinFET 581 in the bottom semiconductor layer 21 (e.g., a second semiconductor layer) and is arranged below the channel sheets 320, S/D epitaxy 308, and work function metal 356 of the SG nanosheet transistor 591 in the top semiconductor layer 22 (e.g., a first semiconductor layer).

Accordingly, the structure 500 in FIG. 19 illustrates that the present disclosure enables the formation of a variety of arrangements and orientations that enable an EG FinFET that is integrated on the same semiconductor layer as an SG FinFET to be stacked with SG nanosheets.

In alternative embodiments of the present disclosure, substantially the same methods and structures described above can be arranged in a different way to enable an EG FinFET that is integrated on the same semiconductor layer as an SG FinFET to be stacked with another EG FinFET that is integrated on the same semiconductor layer as an SG FinFET.

Figure 20:
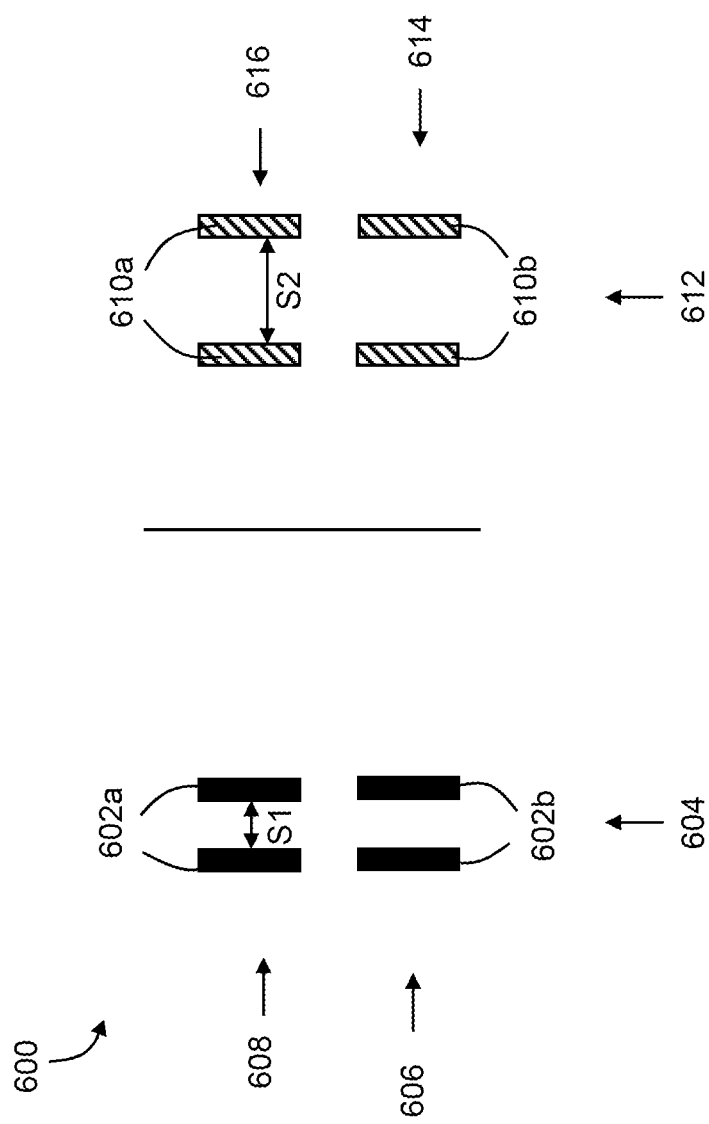
FIG. 20 depicts a schematic diagram illustrating a side view of another example device including stacked FETs, in accordance with embodiments of the present disclosure.

For example, FIG. 20 illustrates an arrangement substantially similar in structure and function to that of the example device 100 shown in FIG. 1, except that in the example device 600 illustrated in FIG. 20, the FET channels 602a and 602b in the first region 604 and the FET channels 610a and 610b in the second region 612 illustrate an SG FinFET 608 and an EG FinFET 616 stacked on top of an SG FinFET 606 and an EG FinFET 616. As illustrated by FIG. 20, the spacing S1 between adjacent channels 602a of the SG FinFET 608 is smaller than the spacing S2 between adjacent channels 610a of the EG FinFET 616. Additionally, the fin pitch, which refers to the distance between the centers of adjacent fins, is also smaller for the SG FinFET 608 than for the EG FinFET 616. Accordingly, the spacing between adjacent channels 602b of the SG FinFET 606 is also smaller than the spacing S2 between adjacent channels 610b of the EG FinFET 614, and the fin pitch is also smaller for the SG FinFET 606 than for the EG FinFET 614. Notably, the spacing and fin pitch for the SG FinFET 608 are substantially similar to the spacing and fin pitch for the SG FinFET 606, and the spacing and fin pitch for the EG FinFET 616 are substantially similar to the spacing and fin pitch for the EG FinFET 614.

Figure 21:
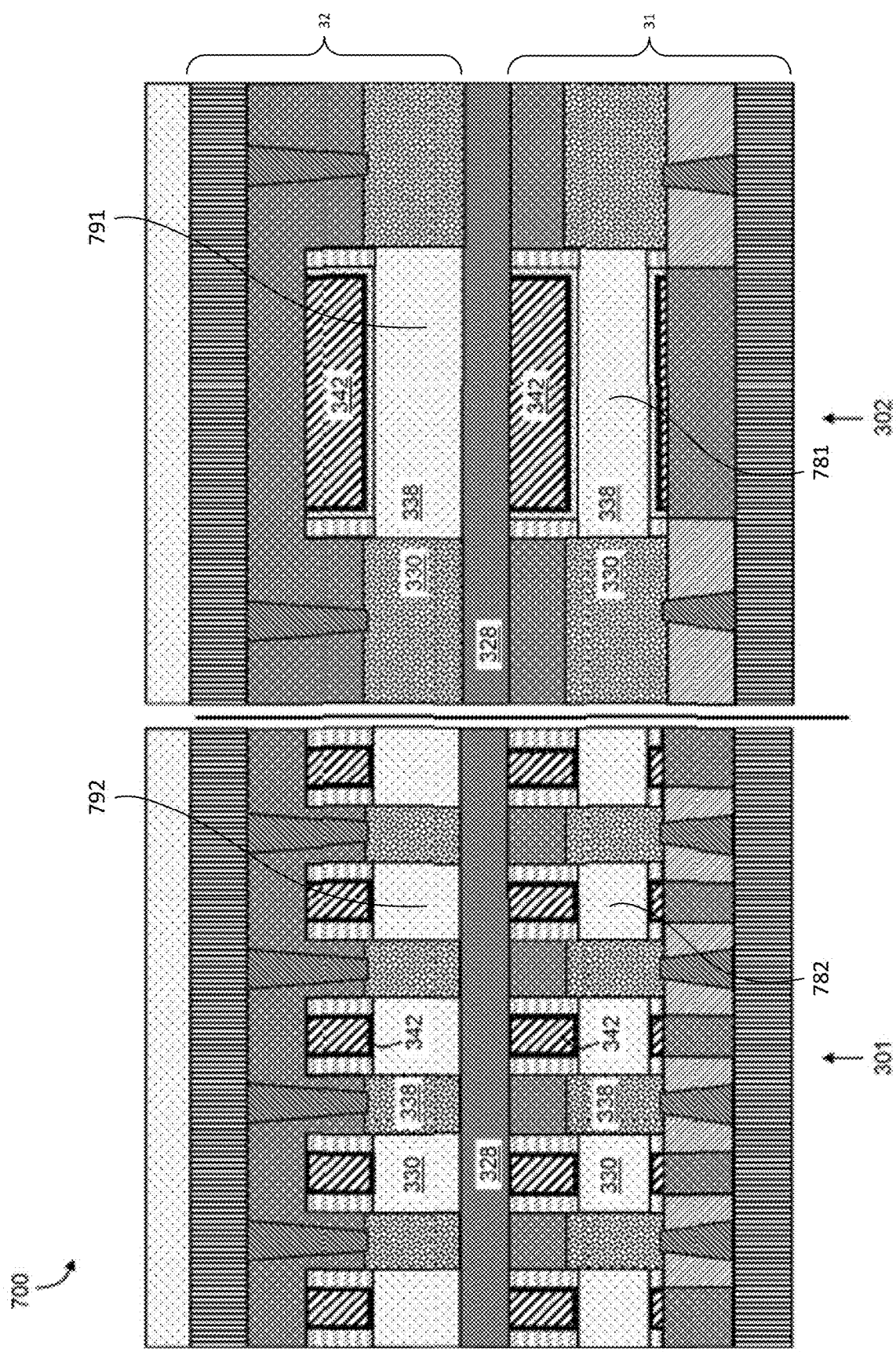
FIG. 21 illustrates a cross-sectional schematic view of an example of a structure including the example device of FIG. 20, in accordance with embodiments of the present disclosure.

FIG. 21 depicts a structure 700 illustrating such an embodiment. Because the SG FinFET and EG FinFETs are formed in both the bottom and the top semiconductor layers 31 and 32 in the structure 700, the processes and structures differ slightly from those described above with respect to structure 300 wherein the SG FinFET and EG FinFET were only formed in the top semiconductor layer 12. For example, in the first portion 301 of the structure 700, the further layer of bonding oxide 328 is arranged between the silicon layer 330, S/D epitaxy 338, and the work function metal 342 of the top SG FinFET 792 in the top semiconductor layer 32 (e.g., a first semiconductor layer) and the silicon layer 330, S/D epitaxy 338, and the work function metal 342 of the bottom SG FinFET 782 in the bottom semiconductor layer 31 (e.g., a second semiconductor layer). Similarly, in the second portion 302 of the structure 700, the further layer of bonding oxide 328 is arranged between the silicon layer 330, S/D epitaxy 338, and the work function metal 342 of the top EG FinFET 791 in the top semiconductor layer 32 (e.g., a first semiconductor layer) and the silicon layer 330, S/D epitaxy 338, and the work function metal 342 of the bottom EG FinFET 781 in the bottom semiconductor layer 31 (e.g., a second semiconductor layer).

Figure 22:
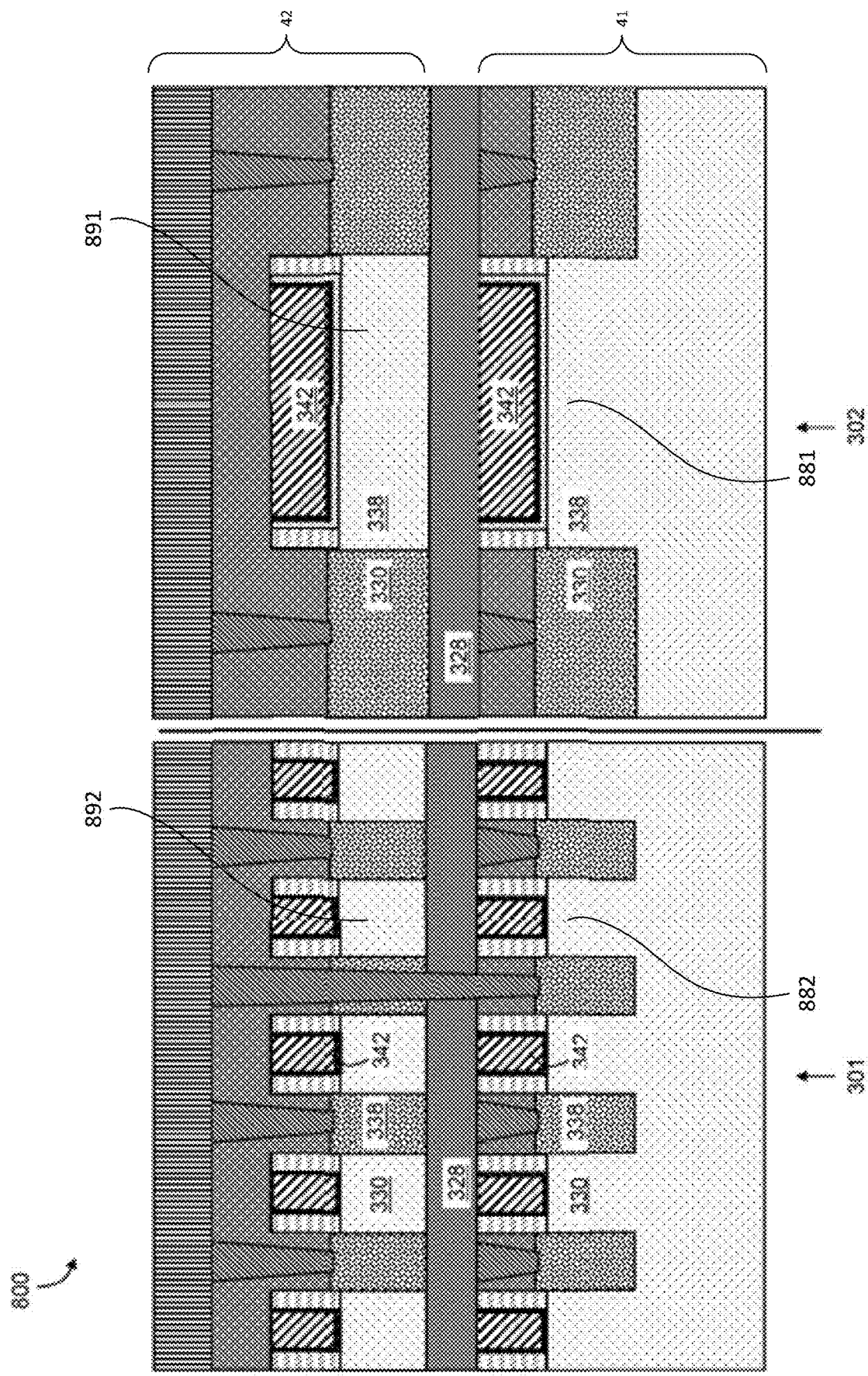
FIG. 22 illustrates a cross-sectional schematic view of an example of a structure including the example device of FIG. 20, in accordance with embodiments of the present disclosure.

Like FIG. 21, FIG. 22 also depicts a structure 800 illustrating another embodiment of the present disclosure wherein an EG FinFET that is integrated on the same semiconductor layer 41 as an SG FinFET is stacked with another EG FinFET that is integrated on the same semiconductor layer 42 as an SG FinFET. Accordingly, in the first portion 301 of the structure 800, the further layer of bonding oxide 328 is arranged between the silicon layer 330, S/D epitaxy 338, and the work function metal 342 of the top SG FinFET 892 in the top semiconductor layer 42 (e.g., a first semiconductor layer) and the silicon layer 330, S/D epitaxy 338

338, and the work function metal 342 of the bottom SG FinFET 882 in the bottom semiconductor layer 41 (e.g., a second semiconductor layer). Similarly, in the second portion 302 of the structure 800, the further layer of bonding oxide 328 is arranged between the silicon layer 330, S/D epitaxy 338, and the work function metal 342 of the top EG FinFET 891 in the top semiconductor layer 42 (e.g., a first semiconductor layer) and the silicon layer 330, S/D epitaxy 338, and the work function metal 342 of the bottom EG FinFET 881 in the bottom semiconductor layer 41 (e.g., a second semiconductor layer).

Like FIG. 21, FIG. 22 also depicts a structure 800 illustrating another embodiment of the present disclosure wherein an EG FinFET that is integrated on the same semiconductor layer as an SG FinFET is stacked with another EG FinFET that is integrated on the same semiconductor layer as an SG FinFET. Accordingly, in the first portion 301 of the structure 800, the further layer of bonding oxide 328 is arranged between the silicon layer 330, S/D epitaxy 338, and the work function metal 342 of the top SG FinFET and the silicon layer 330, S/D epitaxy 338, and the work function metal 342 of the bottom SG FinFET. Similarly, in the second portion 302 of the structure 800, the further layer of bonding oxide 328 is arranged between the silicon layer 330, S/D epitaxy 338, and the work function metal 342 of the top EG FinFET and the silicon layer 330, S/D epitaxy 338, and the work function metal 342 of the bottom EG FinFET.

In contrast with the structure 700 illustrated in FIG. 21, the structure 800 is wired from the front side only. This wiring arrangement is possible in such embodiments because the gate pitches in both portions of the top semiconductor layer are the same as the gate pitches in the respective portions of the bottom semiconductor layer.

Figure 23:
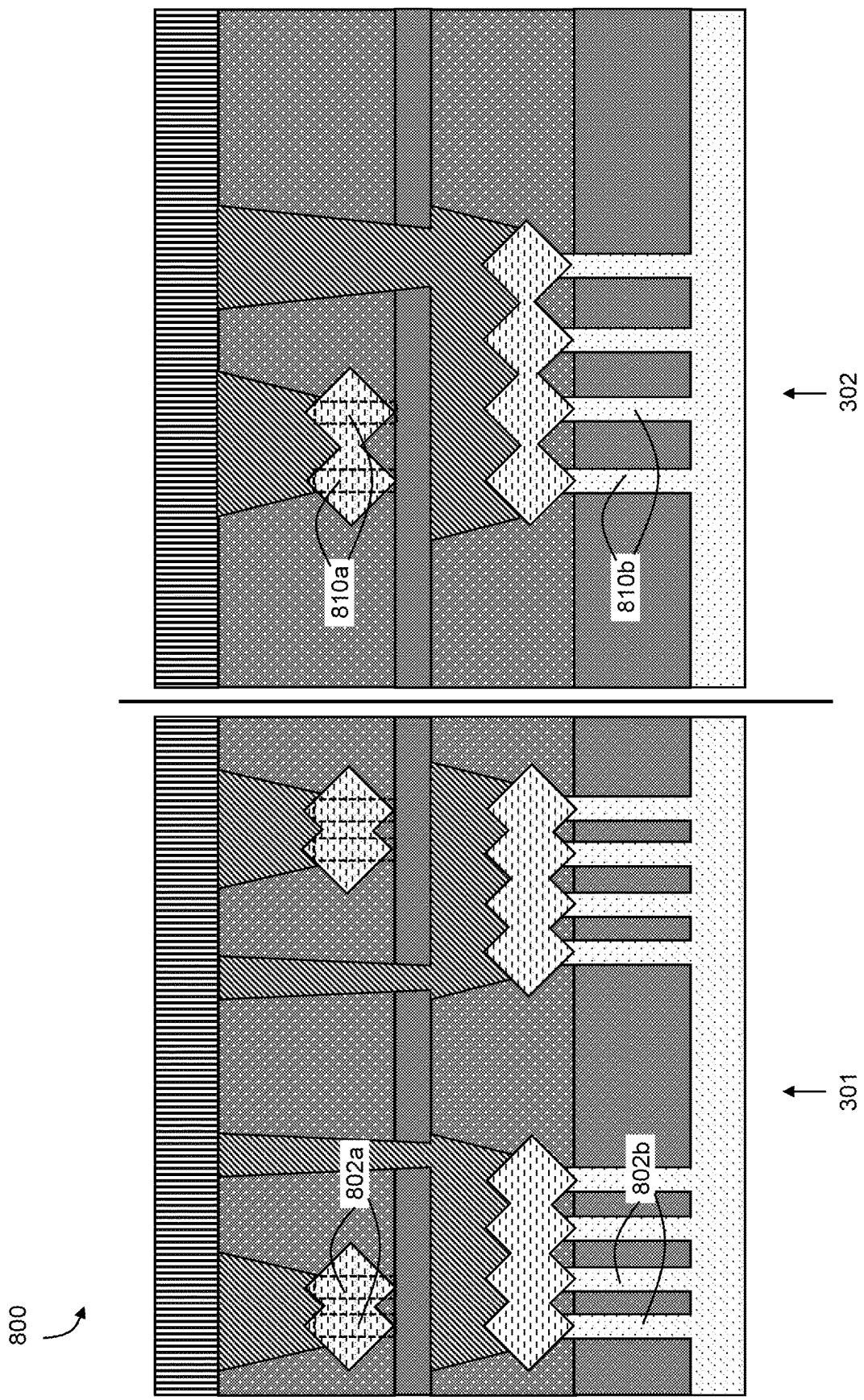
FIG. 23 illustrates another cross-sectional schematic view of the example structure shown in FIG. 22, in accordance with embodiments of the present disclosure.

FIG. 23, which illustrates a cross-sectional view of the same structure 800 as FIG. 22 that is cut through the source/drain regions between two different gates, further illustrates how the structure 800 enables front side wiring for devices that include an EG FinFET that is integrated on the same semiconductor layer as an SG FinFET stacked with another EG FinFET that is integrated on the same semiconductor layer as an SG FinFET. In particular, FIG. 23 illustrates how the spacing between adjacent channels 802*a* and 802*b* of the SG FinFETs in the first portion 301 of the structure 800 is smaller than the spacing between adjacent channels 810*a* and 810*b* of the EG FinFETs in the second portion 302 of the structure 800. Additionally, as shown, the substantial similarity of the spacings between the SG FinFET channels 802*a* and the spacings between the SG FinFET channels 802*b* and the substantial similarity of the spacings between the EG FinFET channels 810*a* and the spacings between the EG FinFET channels 810*b* enable the structure 800 to be wired from the frontside only without interfering with structures having different spacings.

In addition to embodiments described above, other embodiments having fewer operational steps, more operational steps, or different operational steps are contemplated. In some embodiments, operational steps may include the performance of different sub-operations and/or the sub-operations may be performed during the performance of different operational steps. Also, some embodiments may perform some or all of the above operational steps or sub-operations in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. However, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor device, comprising:
a first semiconductor layer including a standard-gate field-effect transistor;
a second semiconductor layer including an extended-gate field-effect transistor, wherein the first semiconductor layer and the second semiconductor layer are formed one on top of another; and
an oxide layer having a first side arranged opposite a second side, wherein the first semiconductor layer is formed on the first side of the oxide layer, and the second semiconductor layer is formed on the second side of the oxide layer,
wherein the second semiconductor layer further includes a further standard-gate field-effect transistor.

2. The semiconductor device of claim 1, wherein:
the extended-gate field-effect transistor includes a first fin separated from a second fin by a first space,
the standard-gate field-effect transistor includes a third fin separated from a fourth fin by a second space, and
the first space is larger than the second space.

3. The semiconductor device of claim 1, further comprising:
front side wiring electrically connected to the first semiconductor layer; and
back side wiring electrically connected to the second semiconductor layer.

4. The semiconductor device of claim 1, further comprising:
front side wiring electrically connected to the second semiconductor layer; and
back side wiring electrically connected to the first semiconductor layer.

5. The semiconductor device of claim 1, wherein:
the standard-gate field-effect transistor is a nanosheet transistor.

6. The semiconductor device of claim 1, wherein:
the extended-gate field-effect transistor is a FinFET.

7. The semiconductor device of claim 1, wherein:
the first semiconductor layer further includes a further standard-gate field-effect transistor.

8. The semiconductor device of claim 1, wherein:
the first semiconductor layer further includes a further extended-gate field-effect transistor.

9. A semiconductor device, comprising:
a first semiconductor layer including a first field-effect transistor device and a second field-effect transistor device;
a second semiconductor layer including a third field-effect transistor device and a fourth field-effect transistor device; and
an oxide layer having a first side arranged opposite a second side,
wherein the first semiconductor layer is formed on the first side of the oxide layer, and the second semiconductor layer is formed on the second side of the oxide layer;
wherein the first semiconductor layer is formed on top of the second semiconductor layer such that the first field-effect transistor device is arranged above the third field-effect transistor device and the second field-effect transistor device is arranged above the fourth field-effect transistor device; and
wherein at least one of the first, second, third, and fourth field-effect transistor devices is an extended-gate field-effect transistor and at least one of the first, second, third, and fourth field-effect transistor devices that is not the extended-gate field-effect transistor is a standard-gate field-effect transistor.

10. The semiconductor device of claim 9, wherein:
the extended-gate field-effect transistor includes a first fin separated from a second fin by a first space,
the standard-gate field-effect transistor includes a third fin separated from a fourth fin by a second space, and
the first space is larger than the second space.

11. The semiconductor device of claim 9, further comprising:
front side wiring electrically connected to the first semiconductor layer; and
back side wiring electrically connected to the second semiconductor layer.

12. The semiconductor device of claim 9, further comprising:
front side wiring electrically connected to the second semiconductor layer; and
back side wiring electrically connected to the first semiconductor layer.

13. The semiconductor device of claim 9, wherein:
at least one of the first, second, third, and fourth field-effect transistors that is not the extended-gate field-effect transistor and is not the standard-gate field-effect transistor is a further standard-gate field-effect transistor.

* * * * *